(12) United States Patent
Adams et al.

(10) Patent No.: US 7,728,339 B1
(45) Date of Patent: Jun. 1, 2010

(54) BOUNDARY ISOLATION FOR MICROELECTROMECHANICAL DEVICES

(75) Inventors: Scott G. Adams, Ithaca, NY (US); Tim Davis, Trumansburg, NY (US)

(73) Assignee: Calient Networks, Inc., Goleta, CA (US)

( * ) Notice: Subject to any disclaimer, the term of this patent is extended or adjusted under 35 U.S.C. 154(b) by 2119 days.

(21) Appl. No.: 10/139,009

(22) Filed: May 3, 2002

(51) Int. Cl.
*H01L 29/207* (2006.01)
*H01L 21/00* (2006.01)

(52) U.S. Cl. ............... 257/98; 257/116; 257/E23.112; 438/50

(58) Field of Classification Search ............ 438/50; 257/98, 116, E23.112
See application file for complete search history.

(56) References Cited

U.S. PATENT DOCUMENTS

| | | | |
|---|---|---|---|
| 3,493,820 | A | 2/1970 | Rosvold |
| 4,104,086 | A | 8/1978 | Bondur et al. |
| 4,509,249 | A | 4/1985 | Goto et al. |
| 4,519,128 | A | 5/1985 | Chesebro et al. |
| 4,571,819 | A | 2/1986 | Rogers et al. |
| 4,670,092 | A | 6/1987 | Motamedi |
| 4,688,069 | A | 8/1987 | Joy et al. |
| 4,706,374 | A | 11/1987 | Murakami |
| 4,784,720 | A | 11/1988 | Douglas |
| 4,851,080 | A | 7/1989 | Howe et al. |
| 4,855,017 | A | 8/1989 | Douglas |
| 4,876,217 | A | 10/1989 | Zdebel |
| 4,922,756 | A | 5/1990 | Henrion |
| 5,068,203 | A | 11/1991 | Logsdon et al. |

(Continued)

FOREIGN PATENT DOCUMENTS

JP     5-55401 A     3/1993

(Continued)

OTHER PUBLICATIONS

Timothy J. Broshnihan, James M. Bustillo, Albert P. Pisano & Roger T. Howe, "Embedded Interconnect & Electrical Isolation for High-Aspect-Ratio, SOI Inertial Instruments," Berkeley Sensor & Actuator Sensor, pp. 637-640, Transducers '97, 1997 International Conference on Solid-State Sensors and Actuators (Chicago, Jun. 16-19, 1997).

(Continued)

*Primary Examiner*—Davienne Monbleau
*Assistant Examiner*—Monica D Harrison
(74) *Attorney, Agent, or Firm*—Blakely, Sokoloff, Taylor & Zafman LLP

(57) ABSTRACT

A micromechanical structure is described. A region of semiconductor material has a first surface, a second surface opposite to the first surface, and a lateral surface that surrounds the region of semiconductor material. Insulative material covers the first surface and the lateral surface of the region of semiconductor material to provide electrical isolation to the region of semiconductor material by forming a boundary. To form the micromechanical structure, a trench is etched in a semiconductor substrate to surround a region of the semiconductor substrate. A surface of the semiconductor substrate and the trench are oxidized to form a top oxide and a lateral oxide region. A backside of the semiconductor substrate is etched to expose a backside of the region of the semiconductor substrate and a portion of the lateral oxide.

25 Claims, 30 Drawing Sheets

U.S. PATENT DOCUMENTS

| | | | |
|---|---|---|---|
| 5,095,752 | A | 3/1992 | Suzuki et al. |
| 5,121,180 | A | 6/1992 | Beringhause et al. |
| 5,172,262 | A | 12/1992 | Hornbeck |
| 5,198,390 | A | 3/1993 | MacDonald et al. |
| 5,287,082 | A | 2/1994 | Arney et al. |
| 5,316,979 | A | 5/1994 | MacDonald et al. |
| 5,393,375 | A | 2/1995 | MacDonald et al. |
| 5,397,904 | A | 3/1995 | Arney et al. |
| 5,399,415 | A | 3/1995 | Chen et al. |
| 5,426,070 | A | 6/1995 | Shaw et al. |
| 5,449,903 | A | 9/1995 | Arney et al. |
| 5,454,906 | A | 10/1995 | Baker et al. |
| 5,463,246 | A | 10/1995 | Matsunami |
| 5,485,039 | A | 1/1996 | Fujita et al. |
| 5,501,893 | A | 3/1996 | Laermer et al. |
| 5,506,175 | A | 4/1996 | Zhang et al. |
| 5,536,988 | A | 7/1996 | Zhang et al. |
| 5,563,343 | A | 10/1996 | Shaw et al. |
| 5,583,373 | A | 12/1996 | Ball et al. |
| 5,599,744 | A | 2/1997 | Koh et al. |
| 5,608,264 | A | 3/1997 | Gaul |
| 5,610,335 | A | 3/1997 | Shaw et al. |
| 5,611,888 | A | 3/1997 | Bosch et al. |
| 5,611,940 | A | 3/1997 | Zettler |
| 5,628,917 | A | 5/1997 | MacDonald et al. |
| 5,629,790 | A | 5/1997 | Neukermans et al. |
| 5,637,189 | A | 6/1997 | Peeters et al. |
| 5,646,067 | A | 7/1997 | Gaul |
| 5,682,062 | A | 10/1997 | Gaul |
| 5,719,073 | A | 2/1998 | Shaw et al. |
| 5,726,073 | A | 3/1998 | Zhang et al. |
| 5,759,913 | A | 6/1998 | Fulford, Jr. et al. |
| 5,770,465 | A | 6/1998 | MacDonald et al. |
| 5,814,889 | A | 9/1998 | Gaul |
| 5,846,849 | A | 12/1998 | Shaw et al. |
| 5,847,454 | A | 12/1998 | Shaw et al. |
| 5,933,746 | A | 8/1999 | Begley et al. |
| 5,973,396 | A | 10/1999 | Farnworth |
| 5,998,816 | A | 12/1999 | Nakaki et al. |
| 5,998,906 | A | 12/1999 | Jerman et al. |
| 6,000,280 | A | 12/1999 | Miller et al. |
| 6,020,272 | A | 2/2000 | Fleming |
| 6,107,109 | A | 8/2000 | Akram et al. |
| 6,121,552 | A | 9/2000 | Brosnihan et al. |
| 6,128,121 | A | 10/2000 | Choi et al. |
| 6,239,473 | B1 | 5/2001 | Adams et al. |
| 6,295,154 | B1 | 9/2001 | Laor et al. |
| 6,353,492 | B2 | 3/2002 | McClelland et al. |
| 6,458,615 | B1 * | 10/2002 | Fedder et al. .......... 438/50 |
| 6,563,106 | B1 | 5/2003 | Bowers et al. |
| 2001/0044165 | A1 | 11/2001 | Lee et al. |
| 2001/0051014 | A1 | 12/2001 | Behin et al. |
| 2002/0127760 | A1 | 9/2002 | Yeh et al. |

FOREIGN PATENT DOCUMENTS

| | | |
|---|---|---|
| WO | WO 94/18697 | 8/1994 |
| WO | WO 97/04283 | 2/1997 |
| WO | WO 99/36941 | 7/1999 |
| WO | WO 99/36948 | 7/1999 |

OTHER PUBLICATIONS

Lynn Michelle Roylance and James B. Angell, "A Batch-Fabricated Silicon Accelerometer," IEEE Transactions on Electron Devices, vol. Ed-26, No. 12, pp. 1911-1917 (Dec. 1979).

Kevin A. Shaw, et al., "SCREAM I: A Single Mask, Single-Crystal Silicon, Reactive Ion Etching Process for Microelectromechanical Structures," Sensors and Actuators A, 40 pp. 63-70 (1994).

Susanne C. Arney and Noel C. MacDonald, et al., "Formation of Submicron Silicon-On-Insulator Sructures by Lateral Oxidation of Substrate-Silicon Islands," J. Vac. Sci. Technol. B vol. 6 No. 1, pp. 341-345, (Jan./Feb. 1988).

Chris Seung-Bok Lee, Sejin Han, Noel C. MacDonald, "Multiple Depth, Single Crystal Silicon MicroActuators for Large Displacement Fabricated by Deep Reactive Ion Etching," Solid-State Sensor and Actuator Workshop, Hilton Head Island, SC, pp. 45-50 (Jun. 8-11, 1998).

Russell Y. Webb, Scott G. Adams, and Noel C. MacDonald, "Suspended Thermal Oxide Trench Isolation for SCS MEMS." SPIE vol. 3519, Boston, MA, pp. 196-199 (Nov. 1998).

Seung Chris B. Lee, "Two-Depth, Single Crystal Silicon Microelectromechanical Systems." A Dissertation Presented to the Faculty of the Graduate School of Cornell University in Partial Fulfillment of the Requirements for the Degree of Doctor of Philosophy, (Jan. 2000).

Noel C. MacDonald, "SCREAM MicroElectroMechanical Systems." Microelectronic Engineering, 32, pp. 49-73 (1996)

Wolfgang Hofmann, Chris S. Lee, and Noel C. MacDonald, Monolithic Three-Dimensional Single-Crystal Silicon Microelectromechanical Systems, Sensors and Materials, vol. 10, No. 6, pp. 337-350 (1998).

Cornel Marxer and Nicolaas F. de Rooij, "Micro-Opto-Mechanical 2×2 Switch for Single-Mode Fibers Based on Plasma-Etched Silicon Mirror and Electrostatic Actuation," Journal of Lightwave Technology, vol. 17, No. 1, pp. 2-6 (Jan. 1999).

Robert E. Mihailovich, Z. L. Zhang, K. A. Shaw, and Noel C. MacDonald, "Single-Crystal Silicon Torsional Resonators." School of Electrical Engineering, Cornell University, Ithaca, NY 14853, pp. 184-188, IEEE (Feb. 1993).

M.T.A. Saif and N. C. MacDonald, "Planarity of Large MEMS," Journal of Microelectromechanical Systems, 5, 79-97 (1996).

Chris S.B. Lee, Sejin Han, and Noel C. MacDonald, "Single Crystal Silicon (SCS) XY-Stage Fabricated by DRIE and IR alignment," MEMS 2000: The Thirteenth Annual International Conference on Micro Electro Mechanical Systems, pp. 28-33 (Jan. 23-27, 2000).

Chris S.B. Lee, Russell Y. Webb, John M. Chong, and Noel C. MacDonald, "Single Crystal Silicon (SCS) MicroMirror Arrays using Deep Silicon Etching and IR Alignment," MEMS 2000: The Thirteenth Annual International Conference on Micro Electro Mechanical Systems, pp. 441-448 (Jan. 23-27, 2000).

G. K. Fedder, S. Santhanam, M. L. Reed, S. C. Eagle, D. F. Guillou, M. S.-C. Lu, and L. R. Carley, "Laminated High-Aspect-Ratio Microstructures In a Conventional CMOS Process," *Proceedings of the IEEE Micro Electro Mechanical Systems Workshop*, San Diego, CA, pp. 13-18 (Feb. 1996).

\* cited by examiner

BOUNDARY ISOLATION FOR MICROELECTROMECHANICAL DEVICES

FIELD

Embodiments of the invention relate to the field of micromechanical and microelectromechanical structures. More particularly, the present embodiments relate to electrical isolation structures for micromechanical and microelectromechanical devices.

BACKGROUND

Microelectromechanical systems (MEMS) are systems employing electrical and mechanical technology that are fabricated using integrated circuit technology at microscopic dimensions. Micromachining processes are used to fabricate MEMS. Micromechanical devices and structures are likewise mechanical devices and structures fabricated using integrated circuit technology at a microscopic scale.

Electrically-actuated MEMS gimbaled mirrors have been designed for optical telecommunication switches for fiberoptic networks. Other MEMS devices have been used for other applications, including pressure and inertial sensing.

MEMS devices have employed electrostatic and capacitive circuits along with higher voltages, leading to problems involving shorting, leakage, parasitic capacitance, capacitive coupling, and reduced breakdown voltages, for example. Trench isolation techniques were developed to provide electrical isolation for MEMS devices to help to minimize such problems.

FIGS. 1A, 1B, and 1C illustrate a traditional trench isolation structure. Silicon beam 10 is comprised of two segments 12 and 14 separated by isolation joint 16. Isolation joint 16 is comprised of silicon dioxide ($SiO_2$), which is a dielectric. A layer 15 of silicon dioxide resides near the top of beam 10. A metal trace layer 11 resides over silicon dioxide layer 15 in order to provide desired electrical connections to particular portions of MEMS structures. Layers 17A and 17B reside on respective sidewalls of silicon beam 10. Layers of silicon dioxide also reside on respective sidewalls of isolation joint 16. The dielectric joint 16 provides a degree of electrical isolation between segments 12 and 14 of beam 16. Although segments 12 and 14 are electrically isolated, they are mechanically coupled via isolation joint 16.

According to one prior art technique, isolation joint 16 is formed by etching a trench in a silicon wafer and then oxidizing the silicon at high temperatures in an oxygen-rich environment. The oxidation process causes the silicon surface to form silicon dioxide. Silicon dioxide grows from the trench walls towards the center of the trench, called the nit line. Eventually the silicon dioxide growing from the two opposing side walls of the trench meets at the nit line, closing the trench opening. Beam 10 is formed by a silicon etch. Silicon dioxide is deposited on the sidewalls of beam 10 and isolation joint 16.

Sometimes degraded electrical isolation can occur with prior art trench isolation. FIG. 2A shows a cross section of silicon dioxide isolation joint 16 with silicon dioxide sidewalls 19A and 19B. Isolation joint 16 tapers near the top, shown as a slight bow shape in cross section. When the silicon wafer is etched, thick "stringers" of silicon 21A and 21B can result because of the shadowing affect of the oxide above the bowed region of isolation joint 16. Before releasing silicon beams from the substrate with an isotropic etch, sidewall oxide layers 19A and 19B are deposited. The sidewall oxide layers on isolation joint 16 protect the underlying structures from being destroyed during a release etch, but also shield the stringers from being etched. The stringers of silicon sometimes wrap around the sides of isolation joint 16. The stringers of silicon are conductive, so they can form a parasitic conductive path around isolation joint 16.

Any exposed silicon on the oxide isolation joint 16 away from the oxide sidewalls is etched during the release etch. Therefore, silicon stringers sometimes go around the sides of isolation joint 16, but generally not under the bottom of isolation joint 16.

FIG. 2B shows a variation of the problem, with thin stringers of silicon 23A and 23B on isolation joint 16. Stringers 23A and 23B are generated from an inductively coupled plasma ("ICP") etch process. Because of alternating deposition-etch procedures, small silicon scallops 23A and 23B can result, each one being a stringer.

Because of the stringer problem, when voltages above 50 volts are used with certain prior art trench isolation, the electrical isolation can degrade and allow currents on the order of microamps. When trench isolation is used on a gimbaled MEMS mirror that is part of an array of MEMS mirrors in an optical telecommunications switch, that level of electrical conduction can be sufficient to disrupt the operation of the mirror array. Degraded electrical isolation can be especially problematic at voltages above 100 volts for a MEMS mirror array.

SUMMARY

A micromechanical structure is described. A region of semiconductor material has a first surface, a second surface opposite to the first surface, and a lateral surface that surrounds the region of semiconductor material. Insulative material covers the first surface and the lateral surface of the region of semiconductor material to provide electrical isolation to the region of semiconductor material by forming a boundary.

A method for forming a micromechanical structure is also described. A trench is etched in a semiconductor substrate to surround a region of the semiconductor substrate. A surface of the semiconductor substrate and the trench are oxidized to form a first oxide and a lateral oxide region. A backside of the semiconductor substrate is etched to expose a backside of the region of the semiconductor substrate and a portion of the lateral oxide.

Other features and advantages of embodiments of the present invention will be apparent from the accompanying drawings and from the detailed description that follows below.

BRIEF DESCRIPTION OF THE DRAWINGS

Embodiments of the present invention are illustrated by way of example and not limitation in the figures of the accompanying drawings in which like references indicate similar elements and in which.

DETAILED DESCRIPTION

Micromechanical and microelectromechanical structures and devices with boundary isolation are described. A dielectric covers the top and lateral regions of an isolated region of silicon. The dielectric provides a boundary that provides electrical isolation. Methods for forming micromechanical and microelectromechanical structures and devices with boundary isolation are also described.

An intended advantage of embodiments of the invention is to maximize electrical isolation to permit a MEMS device to operate at higher voltages without significant parasitic electrical effects, such as parasitic conduction.

As used herein, references to micromechanical structures and devices are intended to include microelectromechanical structures and devices. Likewise, references to microelectromechanical structures and devices are intended to include micromechanical structures and devices.

Figure 1A:
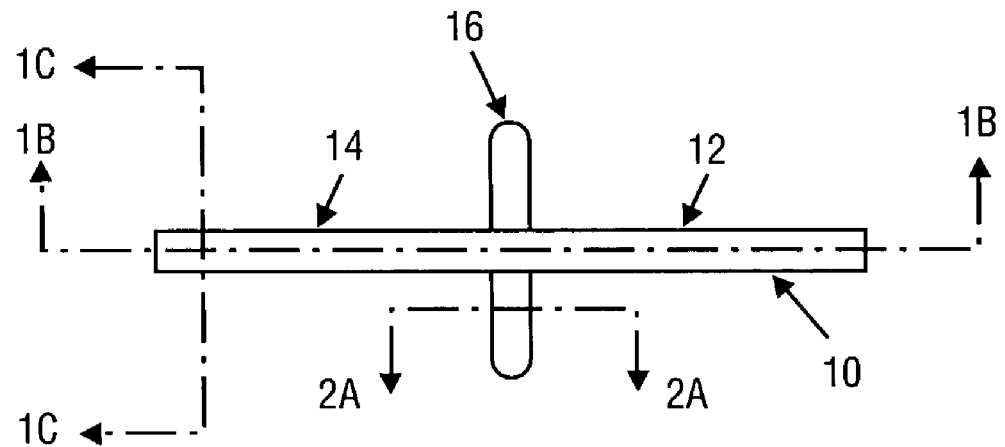
FIGS. 1A, 1B, and 1C show a prior art trench isolation structure.
Figure 1B:
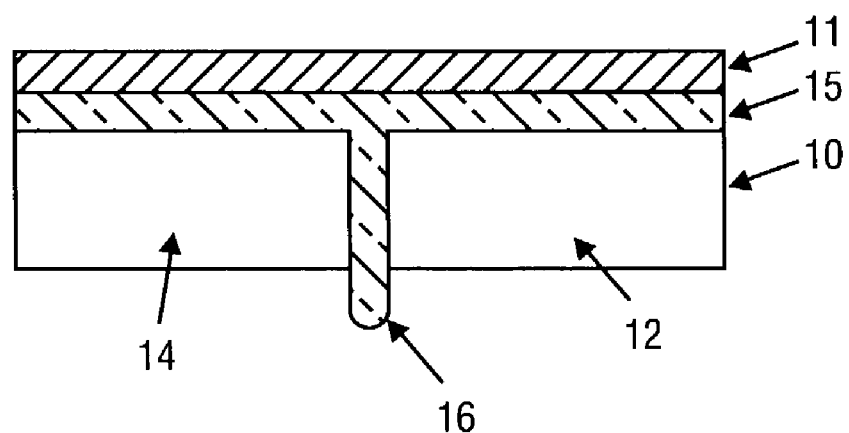
Figure 1C:
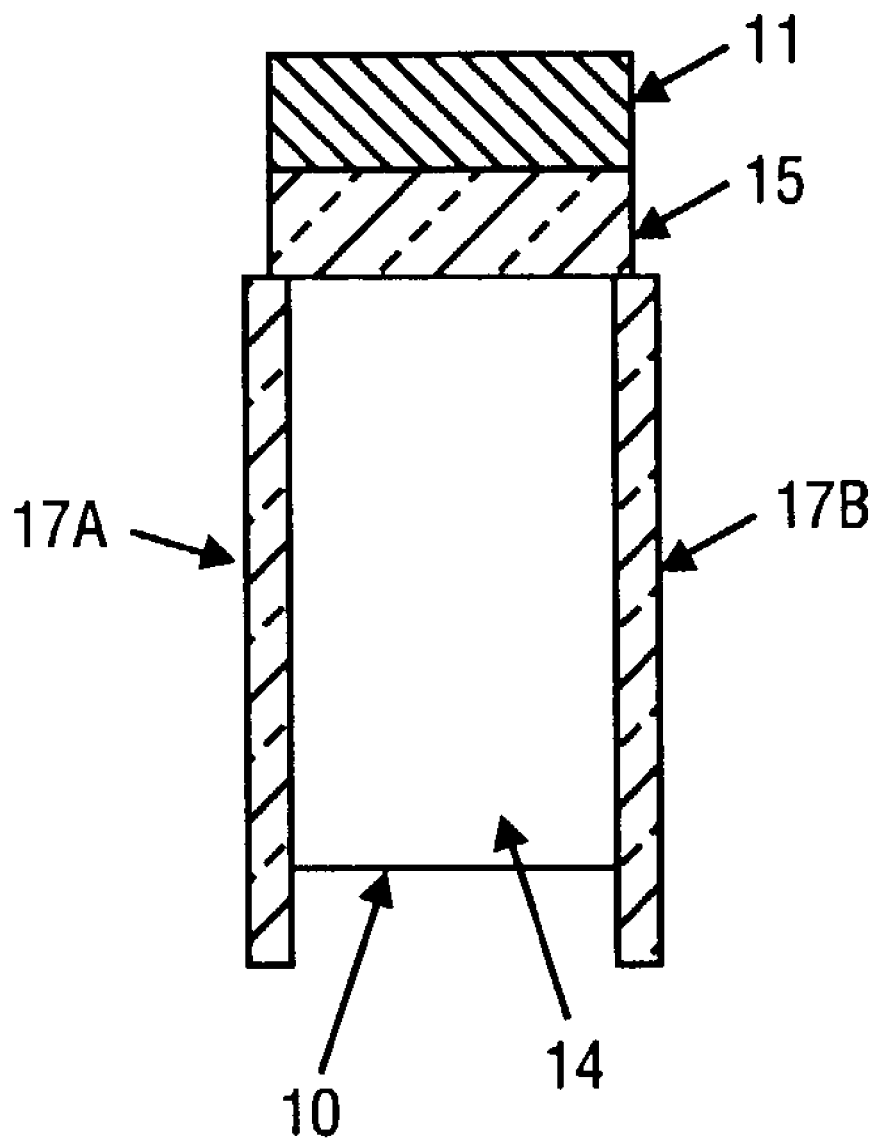
Figure 2A:
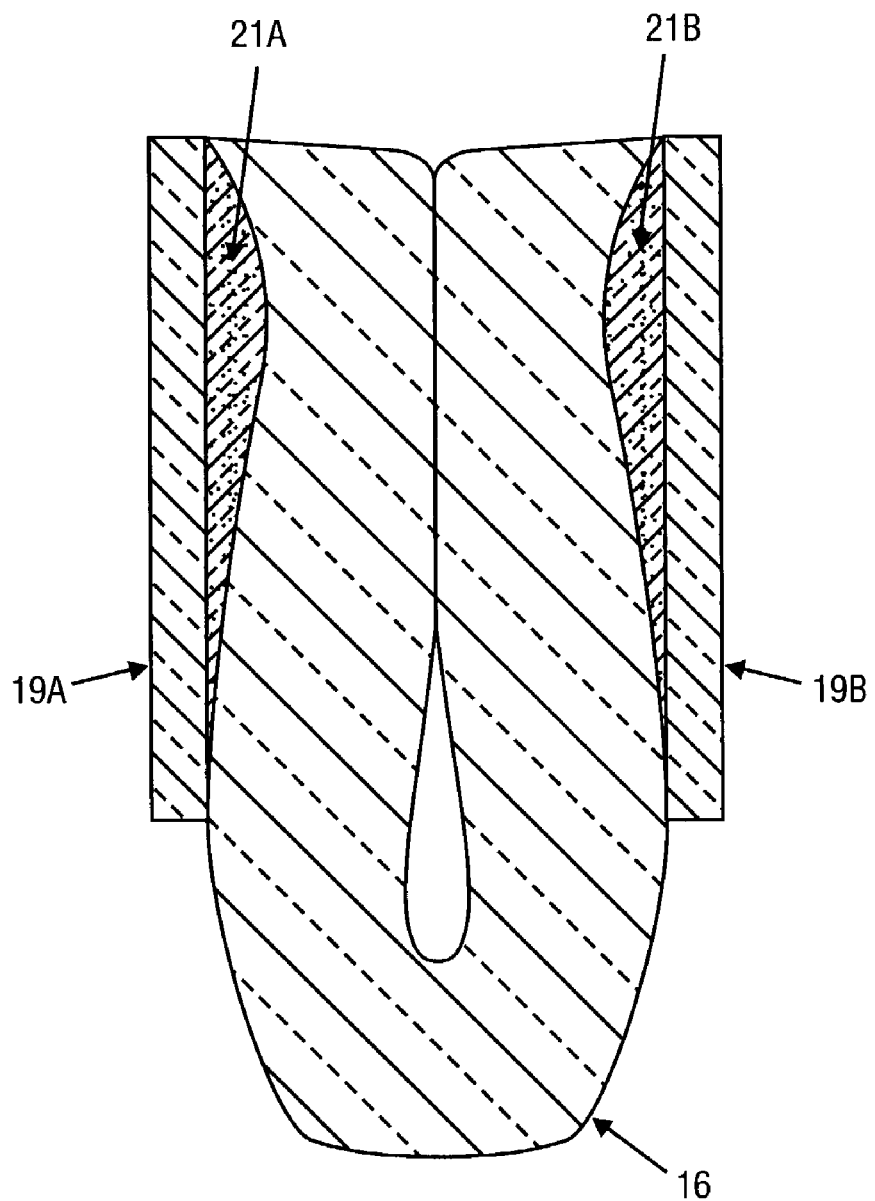
FIGS. 2A and 2B show cross sections of respective prior art isolation joints.
Figure 2B:
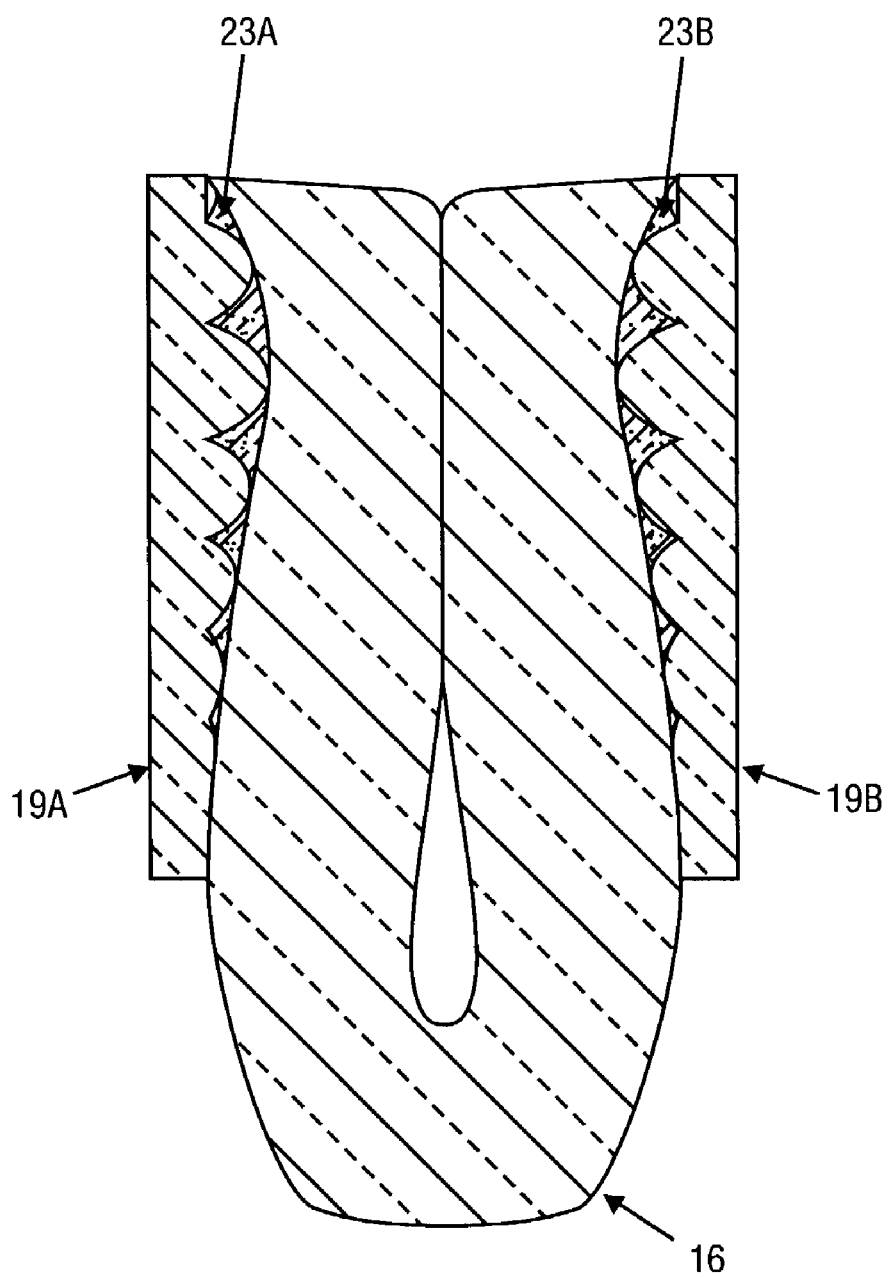
Figure 3:
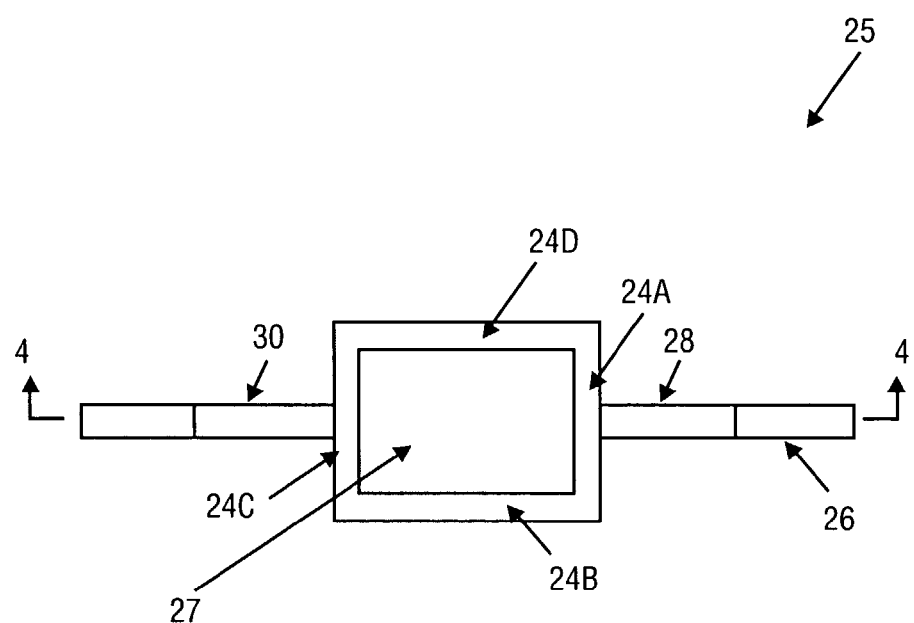
FIG. 3 is a bottom view of a MEMS structure with a region of silicon electrically isolated by a boundary of dielectric material.

FIG. 3 is a bottom view of MEMS structure 25, which includes a region 27 of a semiconductor material. For one embodiment, the semiconductor material in region 27 is monocrystalline silicon. Electrical isolation of region 27 is achieved by surrounding region 27 on the sides (i.e., the lateral regions) and the top surface with a dielectric material, also referred to as an insulative material or an insulator. The dielectric lateral boundary isolation regions 24a-24d are shown surrounding region 27 of silicon.

Figure 4:
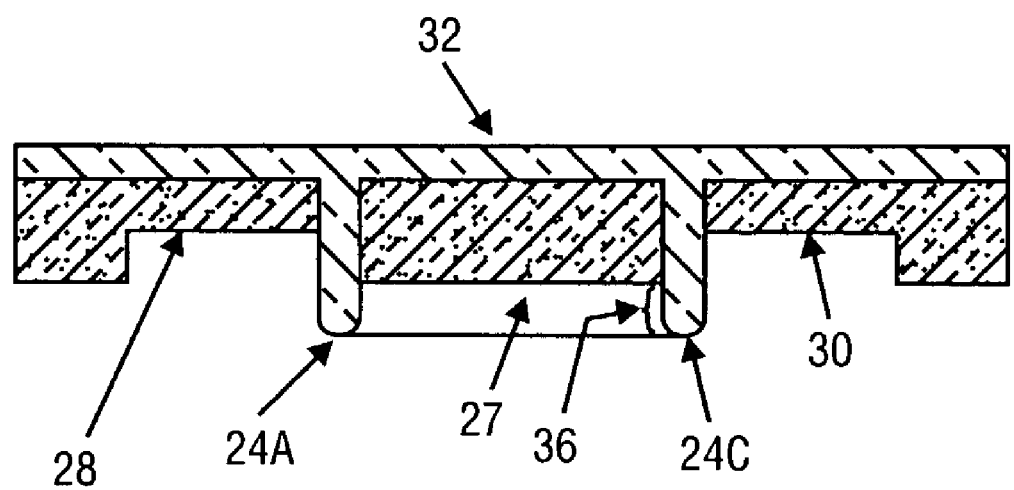
FIG. 4 is a cross-sectional view of the MEMS structure of FIG. 3 employing boundary isolation.

FIG. 4 shows a cross-sectional side view of the MEMS structure 25 of FIG. 3 taken along section line 4. FIG. 4 shows that the region 27 of silicon is bounded on the top by dielectric boundary isolation layer 32 and bounded on the sides by dielectric boundary isolation layers 24a-24d. For one embodiment, the layers 32 and 24a-24d are comprised of silicon dioxide, which is a dielectric. The layers 32 and 24a-24d cover the entire respective top surface and sides of region 27 of silicon. Layer 32 also extends over silicon beams 28 and 30.

For an alternative embodiment, silicon dioxide layer 32 only covers the top of region 27 of silicon and does not extend over silicon beams 28 and 30.

The bottom of silicon region 27 is open. For embodiments of the invention, MEMS structures, members, or devices can reside in region 27.

As shown in FIGS. 3 and 4, silicon beams 28 and 30 are mechanically coupled to boundary isolation regions 24a and 24c. Through boundary isolation, region 27 of silicon is electrically isolated from silicon beams 28 and 30.

For one embodiment, silicon beams 28 and 30 have oxide sidewalls. For other embodiments, silicon beams 28 and 30 do not have oxide sidewalls.

For one embodiment, each of the lateral isolation layers 24a through 24d can be 30 to 100 microns long. For one embodiment, each of the lateral layers or walls 24a-24d is 2 to 4 microns thick. For one embodiment, top dielectric layer 32 is 0.5 to 4 microns thick. For one embodiment, each of the lateral dielectric layers 24a-24d is 30 to 100 microns high. For other embodiments, the dimensions of the dielectric layers and other features of MEMS structure 25 can be smaller or larger.

Boundary isolation helps to maximize electrical isolation because region 27 of silicon is surrounded by dielectric layers 32 and 24a-24d. Any stringers of silicon on the bottom of dielectric layers 24a-24d are removed during the etching process. Although some stringers of silicon may be present on the outer sides of lateral dielectric layers 24a-24d, region 27 of silicon remains electrically isolated because a path of stringers of silicon does not extend into region 27 of silicon.

As shown in FIG. 4, a portion 36 of each of the boundary isolation layers or walls 24a-24d extends beyond the bottom surface of region 27 of silicon. Having portion 36 extend beyond the plane of the surface of region 27 helps to further electrically isolate region 27 of silicon. Oxide layers or walls 24a and 24c extend even farther beyond the bottom surfaces of silicon beams 28 and 30. The portion 36 of each of the lateral dielectric isolation walls 24a-24d provides a barrier to help prevent electrical charges from migrating from silicon beams 28 and 30 to region 27 of silicon (or from migrating between silicon beams 28 and 30 across region 27). Embodiments of the invention can have various heights for portion 36 of each of the lateral layers 24a-24d.

Although in FIG. 4 the bottom surface of region 27 of silicon is shown as planar, for other embodiments the bottom surface of silicon region 27 might not be planar. Indeed, if structures are formed on region 27, the bottom surface of region 27 generally will vary in height given the variations in the etching of the silicon.

For other embodiments of the invention, metal lines or metallic layers can reside on the top of layer 32 facing away from region 27. Those metal lines or metallic layers can extend across silicon beams 28 and 30 in order to reach other MEMS circuitry.

For one embodiment, dielectric layers 32 and 24a-24d provide a continuous boundary without any gaps that would allow electrical leakage. For alternative embodiments, however, MEMS structure 25 could include gaps in isolation layer 32 and maintain the electrical isolation of region 27 of silicon due to the presence of lateral isolation walls 24a-24d. For other alternative embodiments, isolation layer 32 is not included, yet region 27 of silicon remains electrically isolated due to the presence of lateral isolation walls 24a-24d. For those alternative embodiments, the top surface of region 27 of silicon would not be covered. For those alternative embodiments, variations would include having upper oxide layers on beams 28 and 30 and also not having upper oxide layers on beams 28 and 30.

For alternative embodiments of the invention, boundary isolation layers 32 and 24a-24d can comprise other dielectrics besides silicon dioxide. For example, boundary isolation layers 32 and 24a-24d can comprise doped silicon dioxide (for example, a fluorine doped silicon dioxide), silicon nitride, silicon oxynitride, spin-on glass, and borophosphosilicate glass ("BPSG"). For alternative embodiments, boundary isolation layers 32 and 24a-24d can comprise composite films formed from various materials, including the dielectric materials listed above. For one alternative embodiment, layers 32 and 24a-24d comprise a combination of silicon nitride and polysilicon.

For alternative embodiments, other forms of silicon besides monocrystalline silicon can be used for region 27 and beams 28 and 30. For example, region 27 and beams 28 and 30 can be comprised of amorphous silicon, polycrystalline silicon, or epitaxial silicon.

For alternative embodiments, other materials besides silicon could be used for region 27 and for beams 28 and 30. Region 27 and beams 28 and 30 could, for example, comprise gallium arsenide, germanium, or silicon germanium.

For alternative embodiments, an epitaxial layer of gallium arsenide, germanium, or silicon germanium can be used on top of a monocrystalline silicon substrate.

Figure 5:
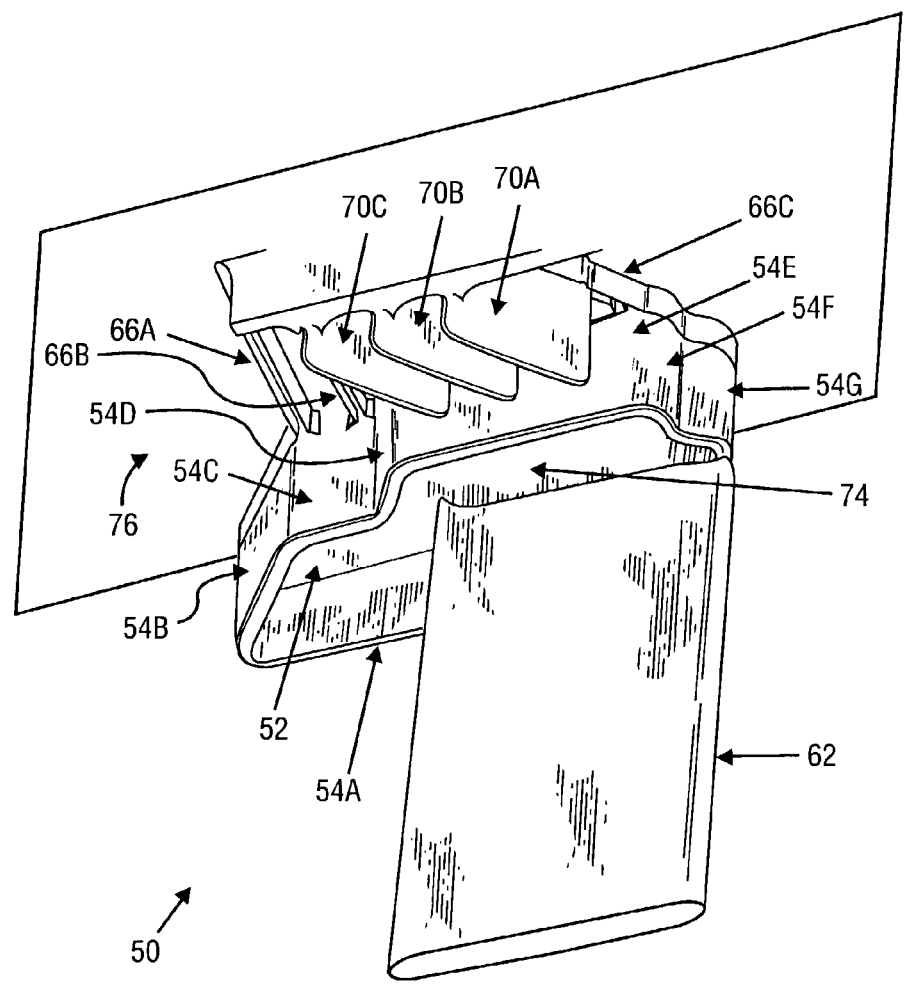
FIG. 5 is a perspective view of a MEMS blade actuator residing in a region of silicon bounded by a dielectric.

FIG. 5 is a perspective view of MEMS structure 50 that includes a monocrystalline silicon blade 62 that resides within region 52 of monocrystalline silicon. Dielectric layers 54a through 54g surround the sides or lateral regions of silicon region 52. Moreover, a top layer of silicon dioxide (not shown) completely covers region 52. The top dielectric layer over region 52 is coupled to dielectric walls 54a-54g. Dielectric lateral layers 54a-54g and the top dielectric layer (not shown) over region 52 provide boundary isolation for region 52, causing region 52 to be electrically isolated.

For one embodiment, blade 62 is formed by a silicon etch that is also used to form region 52 of silicon. For other embodiments, blade 62 can be formed by other means.

For one embodiment, blade 62 is used for electrostatic actuation of a gimbaled MEMS mirror for an optical switch. MEMS structure 50 is on one-half of an actuator structure for a gimbaled silicon mirror for an optical switch. Blade 62 of MEMS structure 50 interacts with a blade (not shown) on the other half of an actuator structure. Blade 62 resides near the edge of region 52 close to dielectric wall 54g so that blade 62 can be close to another blade (not shown) of the gimbaled MEMS mirror in order to interact electrically. The boundary isolation structure 50 of FIG. 5 is advantageous because blade 62 is electrically isolated given that blade 62 resides in region 52, which in turn is electrically isolated because of boundary isolation. The electrical isolation of blade 62 helps to minimize parasitic electrical effects, such as parasitic conduction, in the gimbaled MEMS mirror.

As shown in FIG. 5, dielectric layers or walls 54a-54g extend beyond the surface of electrically isolated region 52. The ramp of silicon material 74 near blade 62 is an artifact of the silicon etch used to form blade 62. Accordingly, the surface of region 52 is not planar.

FIG. 5 also shows silicon beams 66a and 66b that are coupled to dielectric isolation wall 54c. Silicon beam 66c is coupled to dielectric isolation wall 54e. Tensioning structures 70a-70c are coupled to dielectric wall 54e via silicon beams, including silicon beam 66c.

For one embodiment, dielectric isolation layers 54a-54g and the top dielectric layer (not shown) above region 52 are comprised of silicon dioxide. For alternative embodiments, other dielectric materials can be used to form those dielectric layers that provide boundary isolation. For alternative embodiments, other types of materials besides monocrystalline silicon can be used for region 52 and blade 62.

MEMS structure 50, including dielectric isolation layers or walls 54a-54g, resides on substrate 76. For one embodiment, substrate 76 is comprised of monocrystalline silicon. For alternative embodiments, substrate 76 can be comprised of other types of silicon such as amorphous silicon, polycrystalline silicon, and epitaxial silicon. For other alternative embodiments, substrate 76 can be a silicon-on-insulator ("SOI") substrate. For other embodiments, substrate 76 can be comprised of other materials, including gallium arsenide, germanium, and silicon germanium.

For other embodiments of the invention, other types of MEMS structures or devices may reside within electrically-isolated region 52 and have various shapes. For example, various beams, arms, members, and trusses can reside within region 52. Likewise, for other embodiments, inertial sensors, light sensors, electrical sensors, radiation sensors, microphones, motors, electrical circuitry, integrated circuits, integrated active components, integrated passive components, light-emitting diodes, receivers, transmitters, and discrete devices (such as capacitors and conductors), for example, can reside within region 52 and take advantage of the electrical isolation of region 52. As a further example, for other embodiments, a mirror can be fabricated within region 52. For other embodiments, the various mechanical or electrical microstructures residing within region 52 can extend beyond the isolation walls 54a-54g vertically and can extend above and beyond the walls 54a-54g horizontally. The boundary isolation provided by walls 54a-54g and the top dielectric layer (not shown) helps to electrically isolate any mechanical or electrical structure residing in region 52.

For various embodiments of the invention, the structures or devices residing in region 52 can be formed from the monocrystalline silicon used to make region 52 or those structures or devices can be deposited on or coupled to region 52.

For embodiments of the invention, MEMS structures with boundary isolation can have various shapes and be of various sizes. FIGS. 3 through 9 show various shapes and configurations of MEMS structures with boundary isolation. Other shapes and configurations are possible for other embodiments of the invention.

Figure 6:
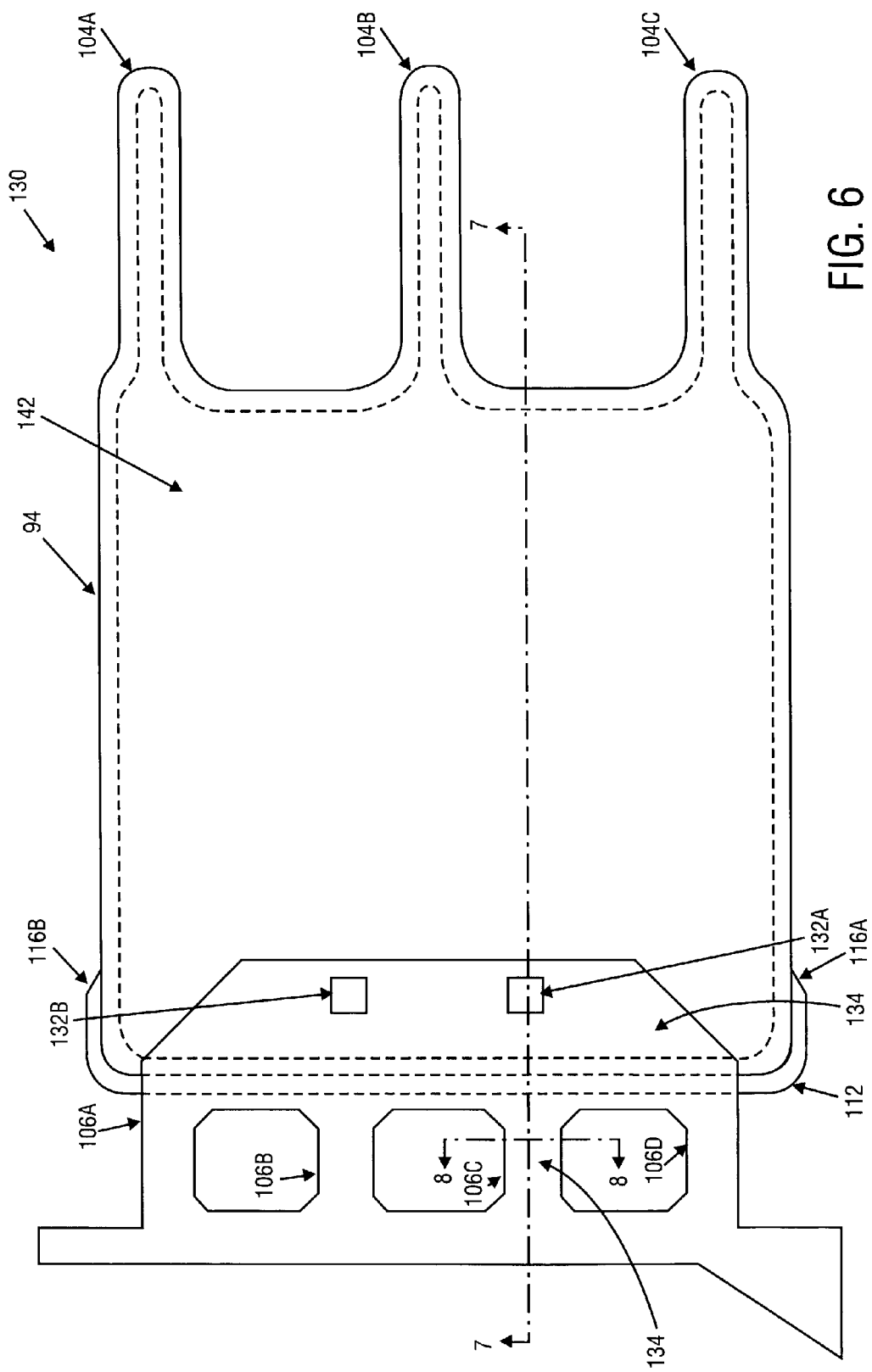
FIG. 6 is a top view of a MEMS structure with boundary isolation, a silicon wrapper, metal routing, and via connections to the bounded region of silicon.
Figure 7:
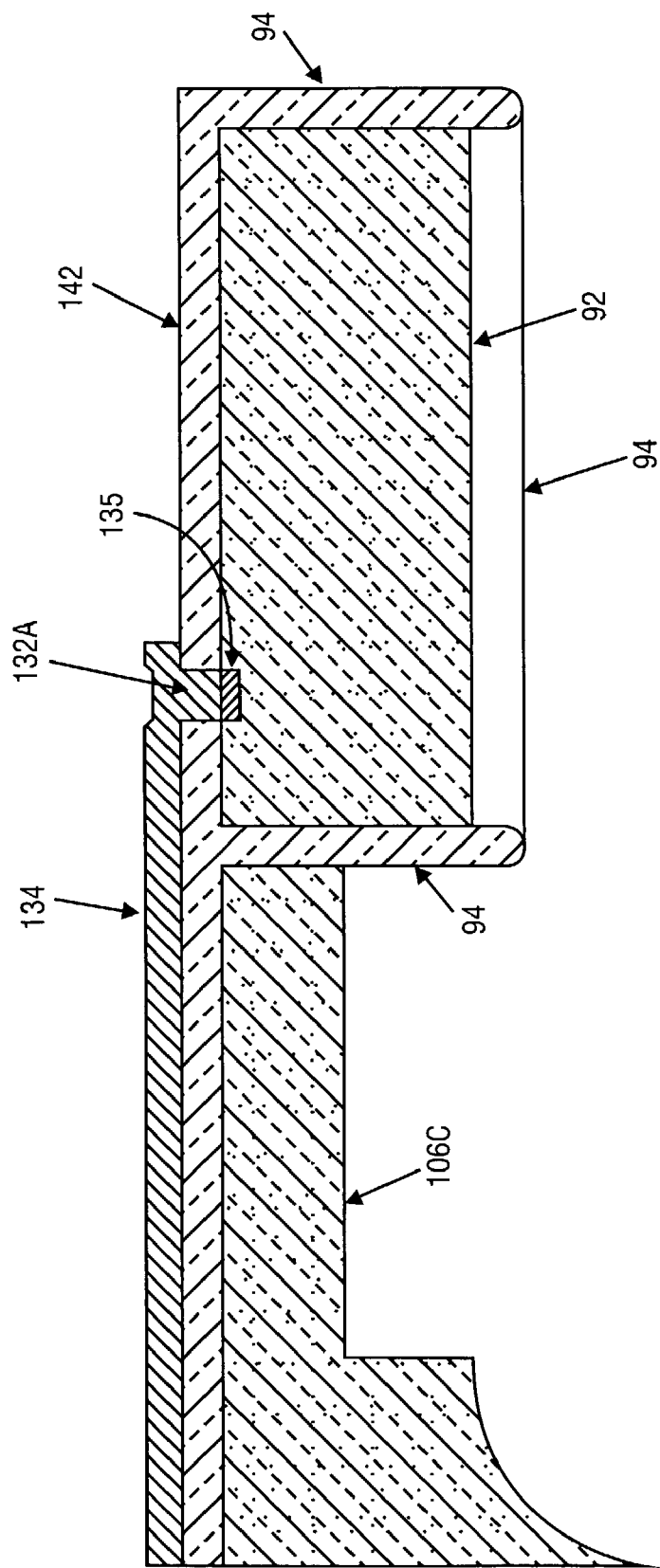
FIG. 7 is a cross-sectional view of the MEMS structure of FIG. 6.

FIG. 6 is a top view of MEMS structure 130. FIG. 7 is a cross-sectional side view of MEMS structure 130 taken along section line 7. MEMS structure 130 includes a region of monocrystalline silicon 92 surrounded by dielectric isolation layer or wall 94. A top dielectric layer 142 resides over region 92. Dielectric layer 94 and the top dielectric layer 142 are comprised of silicon dioxide. For alternative embodiments, other dielectric materials can be used for isolation layers 94 and 142. The dielectric layers form a continuous layer that provides boundary isolation for silicon region 92, which provides electrical isolation for silicon region 92. Silicon region 92 includes finger regions 104a through 104c. Silicon beams 106a-106d are coupled to boundary isolation layer 94.

For one embodiment, a silicon blade resides in each of the fingered regions 104a-104c facing downward. Each of the blades is used for electrostatic actuation in connection with a MEMS gimbaled mirror arrangement. Each of the blades is electrically isolated because the blades are within region 92, which is electrically isolated by the surrounding dielectric layers. The fingered arrangement 104a-104c allows the blades to be close to actuation surfaces.

Silicon wrapper 112 resides on the outside of boundary isolation layer 94 between silicon beams 106a-106d and layer 94. Silicon wrapper 112 helps to smooth the transition from silicon to oxide in order to reduce stresses. Silicon and silicon dioxide have different coefficients of thermal expansion. Thermally induced stresses are reduced by spreading out the stresses by wrapping the silicon around a portion of the oxide layer 94. The silicon wrapper 112 has a variable thickness at locations 116a and 116b. For various embodiments, silicon wrapper 112 can be comprised of various forms of silicon. For other embodiments, wrapper 112 can comprise other materials besides silicon, such as gallium arsenide, germanium, and silicon germanium.

Figure 8:
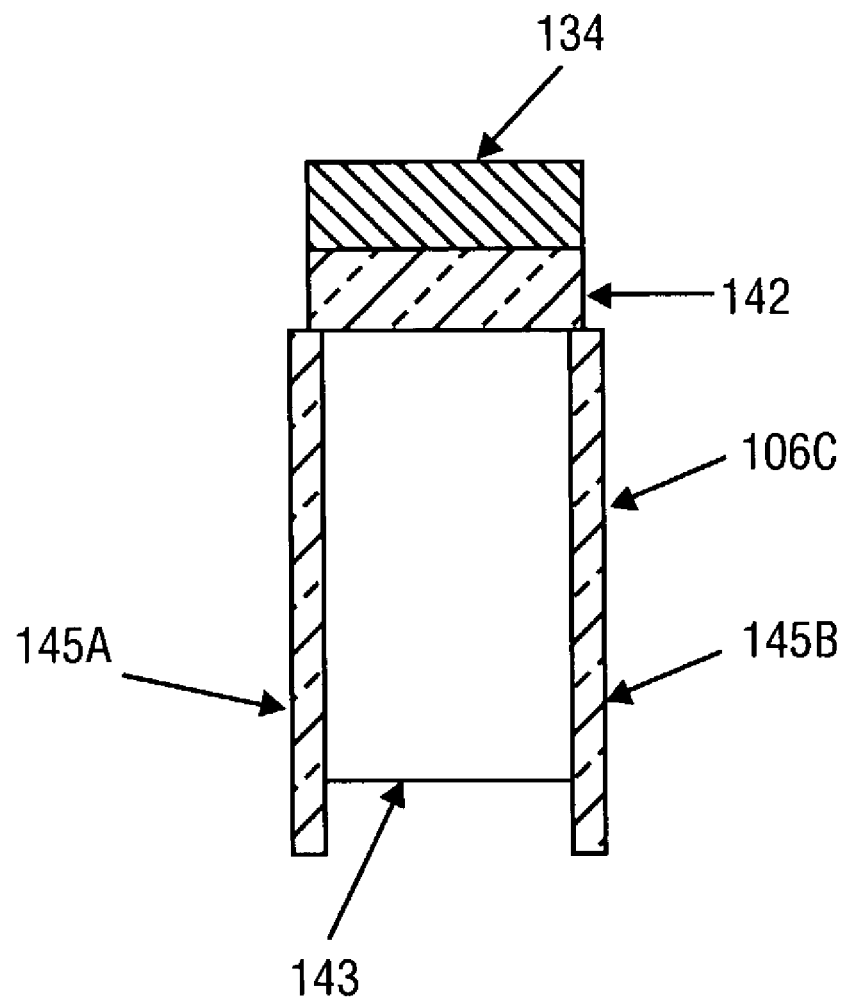
FIG. 8 is a cross-sectional view of a silicon beam of the MEMS structure of FIG. 6.

Silicon beams 106a through 106c couple boundary isolation layer 94 to a portion of the substrate. For various embodiments, silicon beams 106a-106c each have a length from several microns to several hundred microns, although other embodiments can have other lengths. For one embodiment, silicon beams 106a-106c suspend silicon region 92 over a substrate or over other micromechanical structure, such as, for example, a blade of an actuator for a gimbaled MEMS mirror. A cross section of silicon beam 106c along section line 8 is shown in FIG. 8. Silicon beam 106c includes silicon region 143, silicon dioxide sidewalls 145A and 145, and upper silicon dioxide layer 142. Metal layer 134 covers oxide layer 142. For various embodiments, silicon beam 106c has a height of 5 microns to 50 microns and a width of 1 micron to 5 microns. For other embodiments, other heights and widths are possible.

For one embodiment, silicon beams 106a through 106c shown in FIG. 6 are relatively rigid. The approach of using rigid beams 106a-106c can be used in conjunction with an embodiment having blades in regions 104a-104c so that the blades remain relatively fixed.

For alternative embodiments, silicon beams 106a through 106c are instead relatively compliant and permit the boundary isolation region 92 to move relative to a substrate that underlies MEMS structure 130. For those alternative embodiments, silicon beams 106a through 106c comprise compliant lever arms or flexures that allow a range of motion by the boundary isolation region 92 and its surrounding oxide layers 94 and 142.

For other embodiments, a MEMS device, such as a MEMS device with mirrors, can contain a mix of compliant flexures and non-compliant (i.e., rigid) beams connected to boundary isolation structures. For some embodiments, a MEMS device has boundary isolation regions nested inside rigid structures. For a MEMS device, such a MEMS device with mirrors, a compliant flexure can be connected to a rigid frame that in turn is connected to silicon beams that connect to a boundary isolated region.

As shown in FIG. 6, MEMS structure 130 includes vias 132a and 132b that allow metal layer 134 to connect to region 92 of silicon. For one embodiment, metal layer 134 is comprised of aluminum with some silicon or copper content. For other embodiments, other metals may be used for metal layer 134. Metal layer 134 is also referred to as metal routing 134 or metal lines 134.

Region 135 shown in FIG. 7 contains a high concentration of dopants, such as p or n type, in order to create an ohmic contact between silicon region 92 and metal layer 134. Region 135 is used for embodiments that use doping for devices placed in region 92 of silicon, such as embodiments employing integrated circuit transistors in region 92. For other embodiments, region 135 is not used. For those embodiments, the entire region 92 of silicon contains a high concentration of dopants, such as p type or n type, so a separate region 135 is not needed. For example, a MEMS having a blade in region 92 containing a high concentration of dopants would not need a region 135.

Region 92 of silicon is electrically isolated through the use of dielectric boundary layers 94 and 142. Nevertheless, metal layer 134 and vias 132a-132b provide electrical paths to circuitry and electrical devices (not shown) residing within silicon region 92. Region 92 remains electrically isolated from parasitic voltages and currents, however, because the electrical paths through vias 132a-132b go to particular circuitry and electrical devices (not shown).

Figure 9:
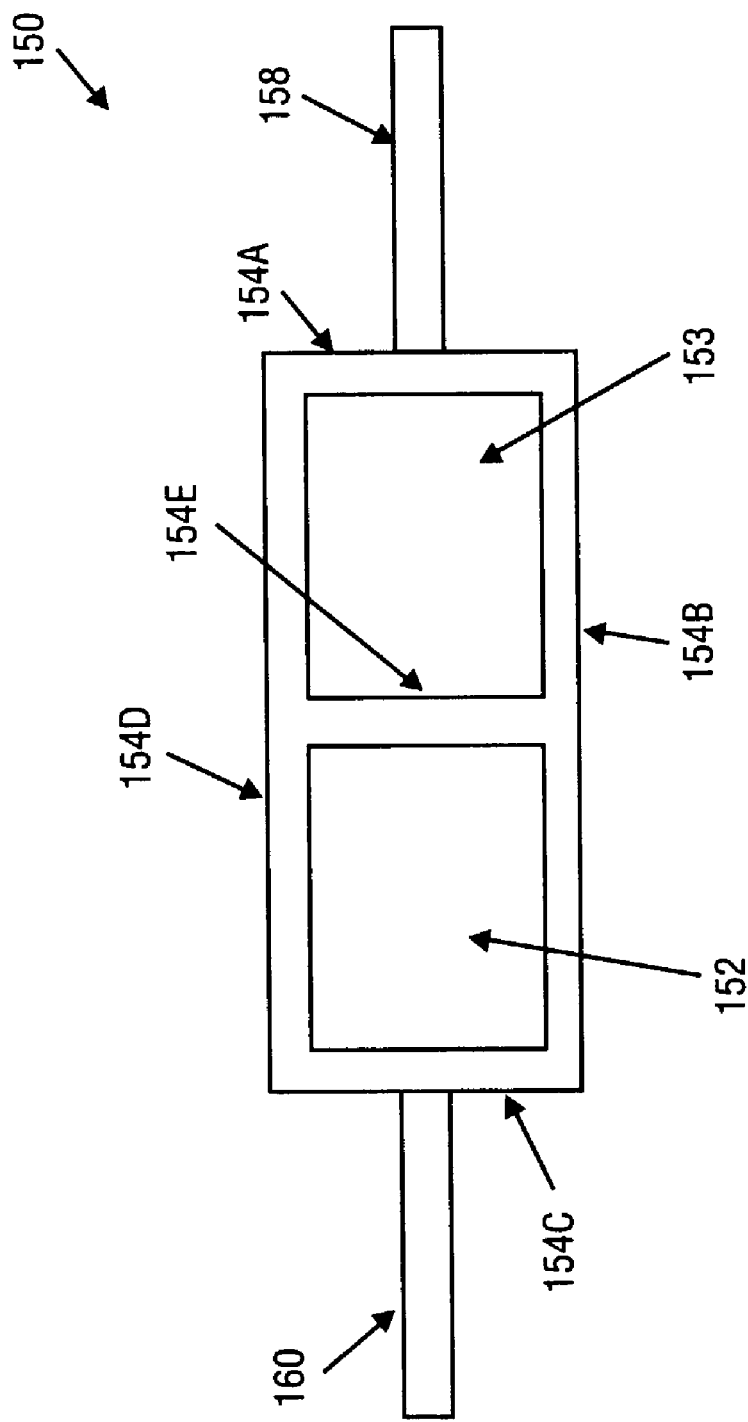
FIG. 9 is a bottom view of a MEMS structure with two regions electrically isolated by a boundary dielectric.

FIG. 9 is a bottom view of another MEMS structure 150 with boundary isolation. MEMS structure 150 includes two regions of monocrystalline silicon that are electrically isolated—namely, regions 152 and 153.

Regions 152 and 153 of silicon each share a common dielectric boundary isolation layer or wall 154e. Boundary isolation walls 154b, 154c, 154d, and 154e surround silicon region 152. Boundary isolation layers or walls 154a, 154b, 154e, and 154d surround boundary isolation region 153. In addition, regions 152 and 153 each have a top dielectric isolation layer (not shown) that resides above each of those regions of silicon.

Silicon beam 158 is mechanically coupled to dielectric isolation wall 154a. Silicon beam 160 is mechanically coupled to dielectric isolation wall 154c.

For one embodiment, the dielectric isolation layers 154a-154e and the top dielectric layer are comprised of silicon dioxide. For alternative embodiments, other dielectric materials may be used. For alternative embodiments, other forms of silicon and other semiconductor materials may be used in regions 152 and 153.

For embodiments of the invention, the MEMS structures with boundary isolation reside on substrates. For alternative embodiments, the MEMS structures with boundary isolation reside on movable platforms.

Figure 10:
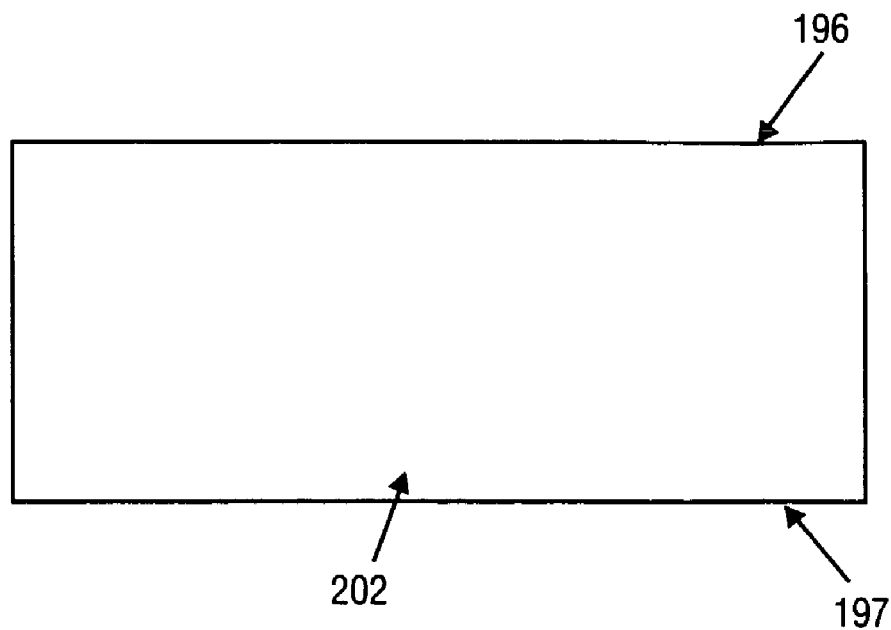
FIGS. 10 through 33 illustrate a micromachining method for forming a MEMS structure with boundary isolation.

FIGS. 10 through 33 illustrate a micromachining method for fabricating a MEMS structure with boundary isolation. One embodiment of the invention uses a monocrystalline silicon wafer. FIG. 10 shows a cross-sectional side view of a portion 202 of a monocrystalline silicon wafer. For one embodiment, the silicon wafer has a thickness in the range of 300 micrometers to 600 micrometers. For other embodiments, the silicon wafer can have other dimensions. The silicon wafer has a topside or top 196 and backside or bottom 197.

Figure 11:
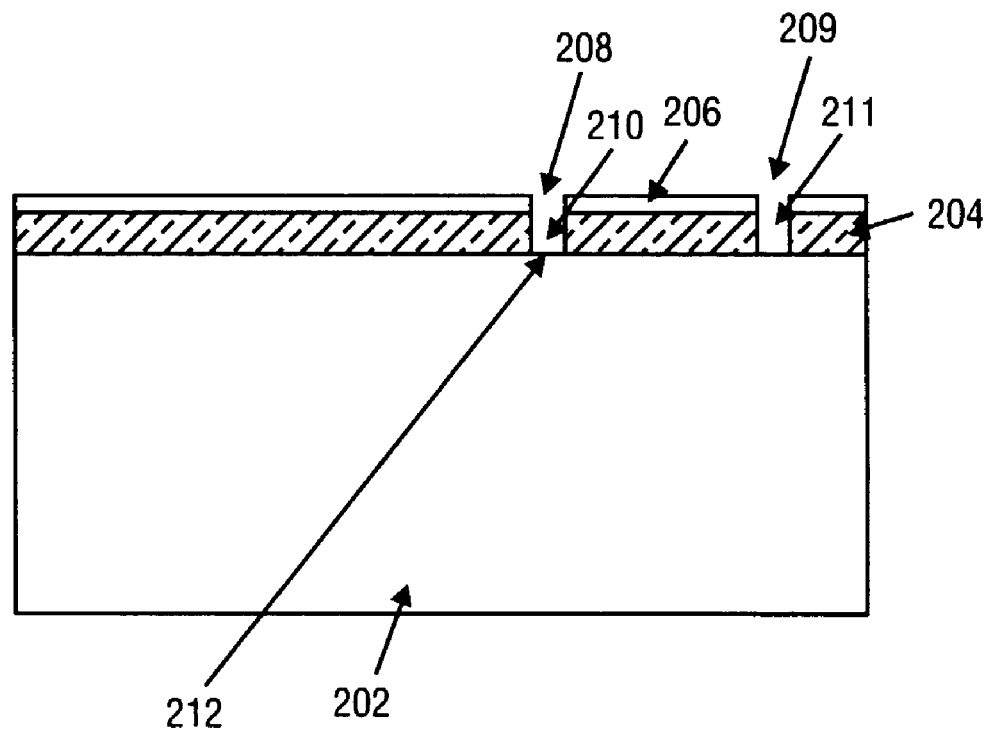

Referring to FIG. 11, silicon wafer section 202 is provided with dielectric layer 204, which for one embodiment is silicon dioxide (i.e., an oxide layer). The silicon can be of arbitrary doping, resistivity, and crystal orientation because the process depends only on reactive ion etching to carve and form the structures. The layer 204 serves the function of protecting the silicon surface of the wafer during an isolation trench etch to follow, and thus represents a masking layer only. This masking layer can be formed from any number of techniques, including thermal oxidation of silicon or chemical vapor deposition ("CVD"). The typical thickness of the masking layer 204 is 0.5-1.0 micrometers. A photoresist 206 is then spun onto the wafer and exposed and developed using standard photolithography techniques to define the isolation trench pattern 208 and 209. Reactive ion etching is used to transfer the photoresist pattern to the mask layer 204, as at locations 210 and 211, exposing the silicon surface 212. Typically, the silicon dioxide mask is etched in a Freon gas mixture, for example, $CHF_3$ or $CF_4$. High rates for silicon dioxide etching are achieved using a high density plasma reactor, such as an inductively coupled plasma ("ICP") chamber. These ICP chambers use a high power radio frequency ("RF") source to sustain the high density plasma and a lower power RF bias on the wafer to achieve high etch rates at low ion energies. Oxide etch rates of 200 nanometers per minute and selectivities to photoresist greater than 1:1 are common for this hardware configuration.

Figure 12:
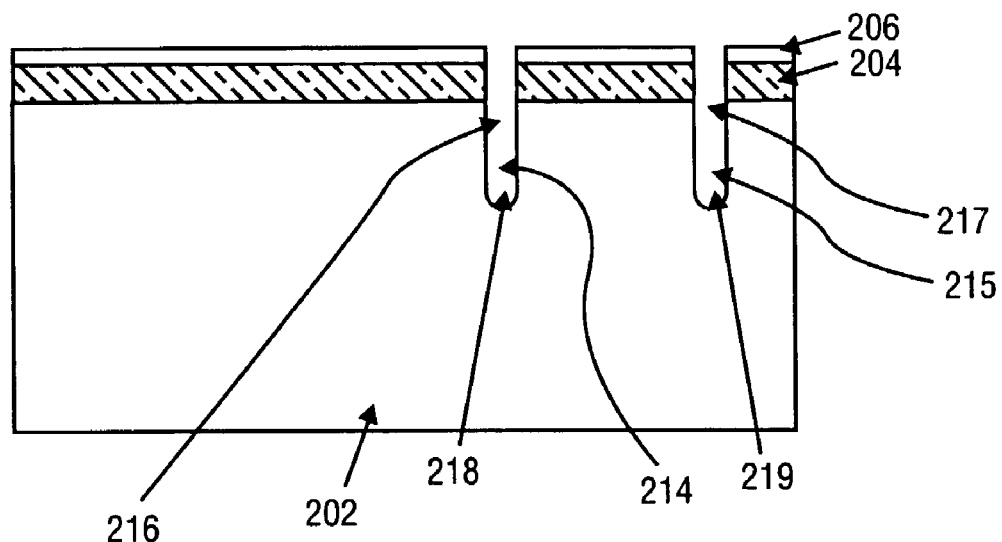

As illustrated in FIG. 12, isolation trenches 214 and 215 are next formed in the wafer 202 by deep reactive ion etching of silicon using high etch rate, high selectivity etching. The trench is commonly etched in a high density plasma using sulfur hexaflouride ($SF_6$) gas mixture as described in U.S. Pat. No. 5,501,893. Preferably, the etch is controlled so that the trench profile is reentrant, or tapered, with the tops 216 and 217 of the respective trenches being narrower than the respective bottoms 218 and 219 of the respective trenches. This tapering ensures that good electrical isolation is achieved in subsequent processing. Profile tapering can be achieved in reactive ion etching by tuning the degree of passivation, or by varying the parameters (power, gas flows, pressure) of the discharge during the course of the etch. Because the trenches are to be filled with dielectric, the openings at the tops 216 and 217 of the trenches are chosen to be less than 2 micrometers ("um") in width. Each trench depth is typically in the range 10-50 um. A common procedure for etching each trench is to alternate etch steps ($SF_6$ and argon mixture) with passivation steps (Freon with argon) in an ICP plasma to achieve etch rates in excess of 2 um/min at high selectively to photoresist (>50:1) and oxide (>100:1). The power and time of the etch cycles are increased as the trench deepens to achieve the tapered profile. Although the trench geometry is preferably reentrant, arbitrary trench profiles can be accompanied with adjustments in microstructure processing. Good isolation results can be achieved with any of a number of known trench etch chemistries. After the silicon trench is etched, the photoresist layer 206 is removed with wet chemistry or dry ashing techniques, and the masking layer 204 is removed with a reactive ion etch ("RIE") or buffered hydrofluoric acid.

Figure 13:
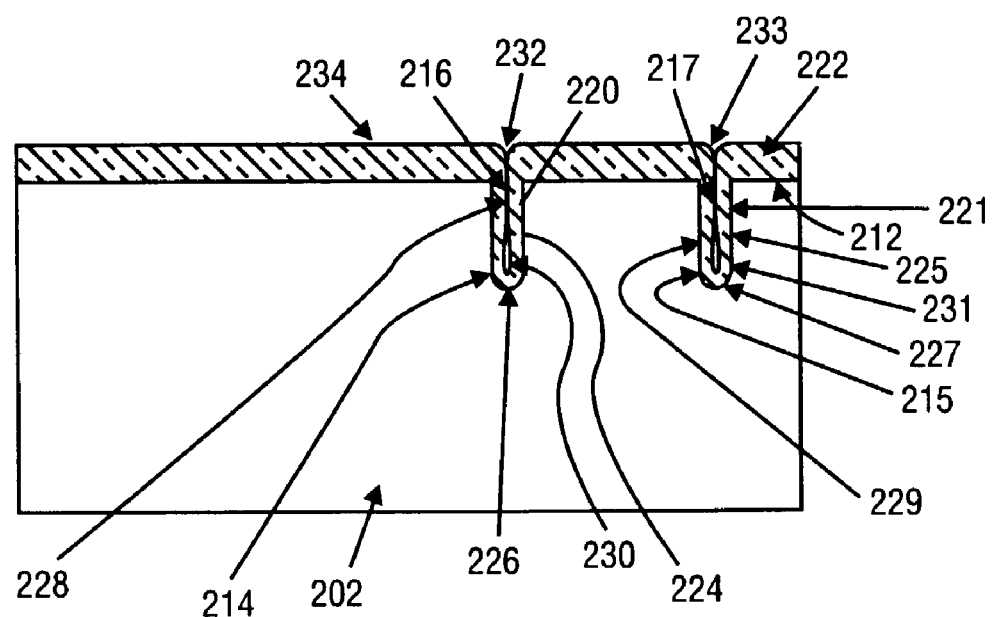

Referring to FIG. 13, the isolation trenches 214 and 215 are then filled with an insulating dielectric material, typically silicon dioxide. The filling procedure results in the mostly solid isolation segments 220 and 221 in the respective trenches 214 and 215, and serves to deposit a layer 222 of dielectric material on the top surface 212 of the silicon wafer and dielectric layers on the sidewalls 224 and 225 and bottoms 226 and 227 of the respective trenches. The thickness of the deposited layer is usually in excess of 1 um. This fill can be accomplished with chemical vapor deposition ("CVD") techniques or preferably with oxidation of silicon at high temperatures. In thermal oxidation, the wafer is exposed to an oxygen-rich environment at temperatures from 900-1150° C. This oxidation process consumes silicon surfaces to form silicon dioxide. The resulting volumetric expansion from this process causes the sidewalls of the trenches to encroach upon each other, eventually closing the trench opening. In a CVD fill, some dielectric is deposited on the walls but filling also occurs from deposition on the bottom of the trench. CVD dielectric fill of trenches has been demonstrated with TEOS or silane mixtures in plasma enhanced CVD chambers and low pressure CVD furnace tubes.

During a trench fill, it is common for most trench profiles to be incompletely filled, causing interfaces 228 and 229 and voids 230 and 231 to be formed in the respective trenches. A local concentration of stress in the void can cause electrical and mechanical malfunction for some devices, but is generally unimportant for micromechanical devices due to the enclosed geometry of the isolation segments or layers 220 and 221. The interfaces 228 and 229 and voids 230 and 231 can be eliminated by shaping the respective trenches to be wider at the respective trench openings 216 and 217 than the respective trench bottoms. However, good electrical isolation would require the additional tapering of the microstructure trench etch in the later steps. Other artifacts of the trench filling are the indentations 232 and 233 that are created in the surface of the dielectric 234 centered over the respective isolation segments 220 and 221. These indentations are unavoidable in most trench filling processes, and can be as deep as 0.5 um, depending on the thickness of the deposition.

Figure 14:
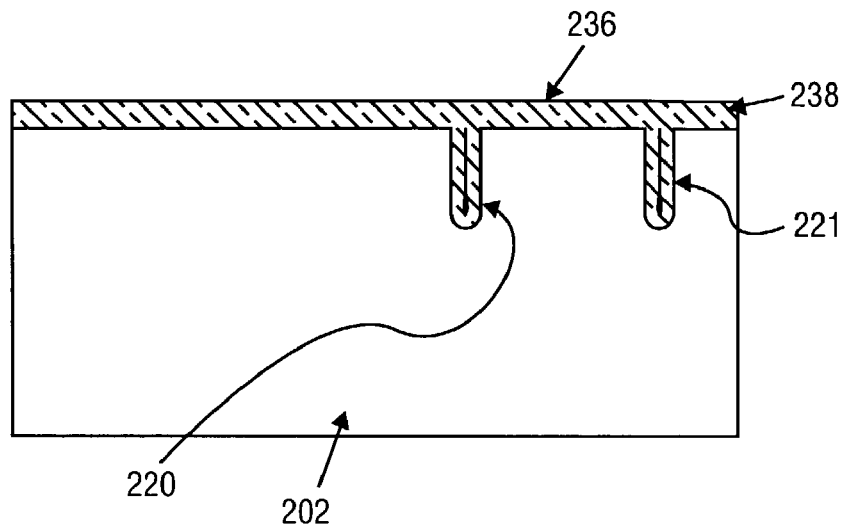

To remove the indentations 232 and 233, the surface is planarized to form a flat surface 236, as illustrated in FIG. 14, for subsequent lithographic and deposition steps. Planarization is performed by depositing a viscous material, which can be photoresist, spin-on glass, or polymide, and flowing the material to fill the indentations 232 and 233 to a smooth finish. Etchback is the second stage of planarization. For one embodiment, the etchback is performed by etching back to the silicon and then regrowing the desired thickness of silicon dioxide to create a uniform thickness layer 238 with a planar surface 236.

For an alternative embodiment, a partial etchback, rather than a full etchback, is performed as the second stage of planarization. For partial etchback, surface 236 is etched uniformly, including the filled indentation. By removing part of the surface oxide 222, the indentations 232 and 233 are removed to create a uniform thickness layer 238. For example, if the original dielectric layer 222 is 2 um, then planarization removes the indentations 232 and 233 and leaves a dielectric layer 238, which has a final thickness of less than 1 um. The surface 236 of wafer is then ready for further lithography and deposition.

Figure 15:
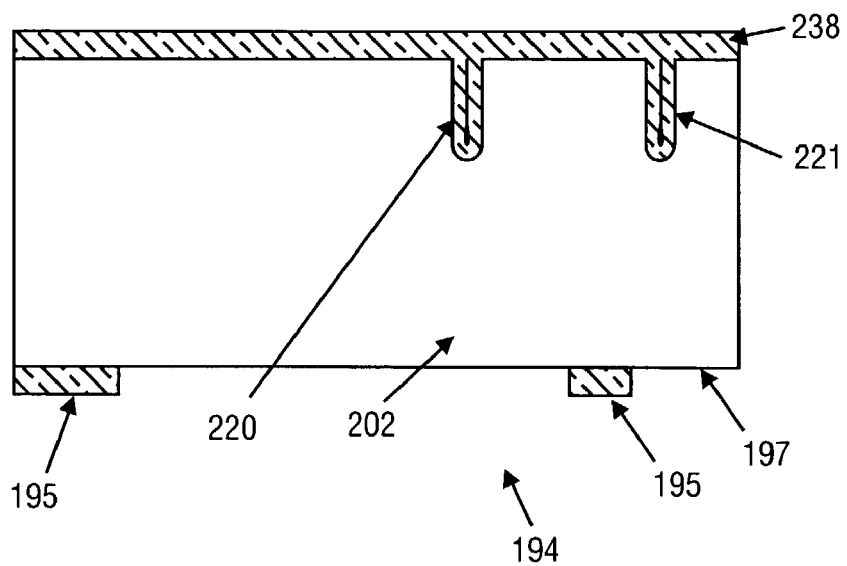

FIG. 15 shows silicon wafer section 202 with dielectric layer 238 and isolation trenches 220 and 221. After the isolation trenches 220 and 221 are fabricated, standard front-to-back alignment is used to lithographically pattern the masking layer for a blade and an isolation region on the backside 197 of the wafer. A pattern 194 is exposed and etched into a dielectric masking layer 195. The masking layer 195 is typically comprised of a combination of thermally grown silicon oxide and oxide deposited by chemical vapor deposition. The lithography pattern is transferred in the masking layer by reactive ion etching. The backside 197 is not etched, however, until later in the process. Etching backside 197 at this point would thin the wafer 202 too much for subsequent lithography steps on the top side. The backside pattern 194 is typically aligned with respect to the topside isolation trenches 220 and 221 to within 1 um to 3 um.

Figure 16:
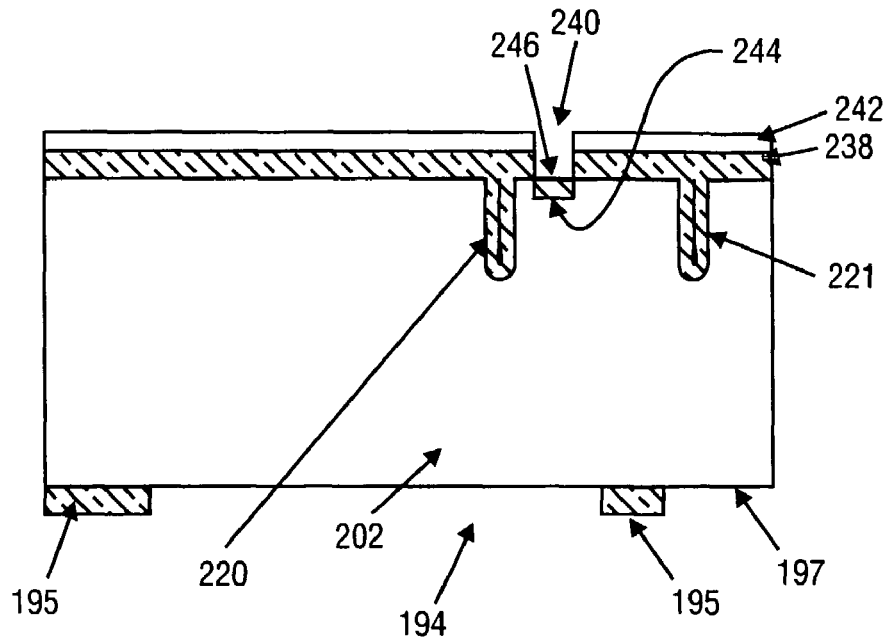

Metallization on the topside 196 of the wafer then proceeds as in FIG. 16. In order to make contact to the underlying silicon, a via is patterned and etched into the dielectric layer using standard lithography and reactive ion etching. After the via is etched, metallization is deposited and patterned to form an interconnect and a contact to the silicon through the via. For one embodiment, the metal is aluminum and is patterned using wet etching techniques. For MEMS mirror arrays with high interconnect densities, it is advantageous to instead pattern the metal using dry etching or evaporated metal lift-off techniques to achieve finer linewidths. The metal layer is used to provide bond pads and interconnects, which connect electrical signals from control circuitry to each mirror to control mirror actuation. The process for forming the vias and the metallization layer is described in more detail in connection with FIGS. 16, 17, and 18.

In FIG. 16, a second photolithography operation opens vias to prepare contacts to the underlying silicon 202. This second lithographic step is performed by exposing and developing a pattern of via openings, such as via opening 240, in a layer of resist 242 on surface 246 and transferring the pattern into the underlying dielectric layer 238. After lithography, the silicon is implanted in the region 244 using dopants matched to the substrate silicon 202. A high concentration of dopants, either p or n type, in the region 244 will serve to create an ohmic contact between the silicon and a metal layer on the surface of dielectric layer 238. The silicon region 244 may be protected from implant damage by leaving a thin layer of dielectric at the surface 246 of the silicon. After the silicon is implanted, the resist 242 is removed with wet chemicals or ashing and the wafer is annealed to activate the implanted ions.

For another embodiment, the operations involving implanting dopants in region 244 are skipped. Instead, the wafer 202 itself is implanted. In other words, a heavily doped wafer is purchased to be used in the process operations. The approach can be used if one will not form transistors on the wafer.

Figure 17:
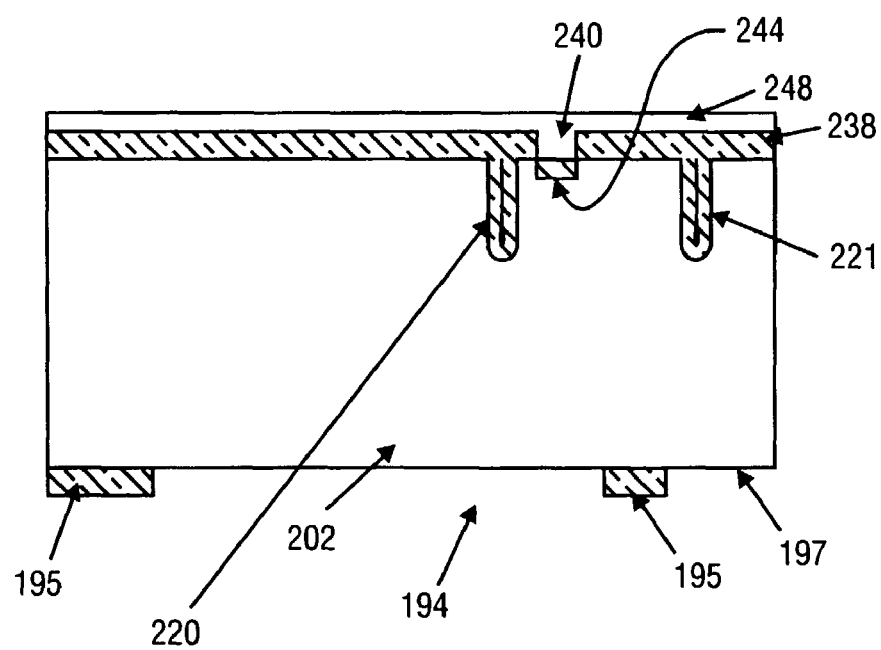

A sputtered metal layer 248, preferably aluminum, is deposited in FIG. 17. The metal covers the surface 236 of the dielectric 238, and uniformly coats over the isolation segment 220 as a result of the planarizing step. The metal layer fills the via 240 and contacts the implanted region of silicon at 244, electrically connecting the metal to the silicon to form an ohmic contact. Otherwise the metal layer is insulated from the substrate silicon 202 by means of the dielectric layer 238. The thickness of the metal layer is nominally 0.5 um, although an arbitrary thickness is acceptable. Sputtering is preferably used instead of evaporation because of the ease of volume production. As known in the prior art, some silicon or copper content in an aluminum layer, or target, will improve resistance to electromigration-induced failure.

Figure 18:
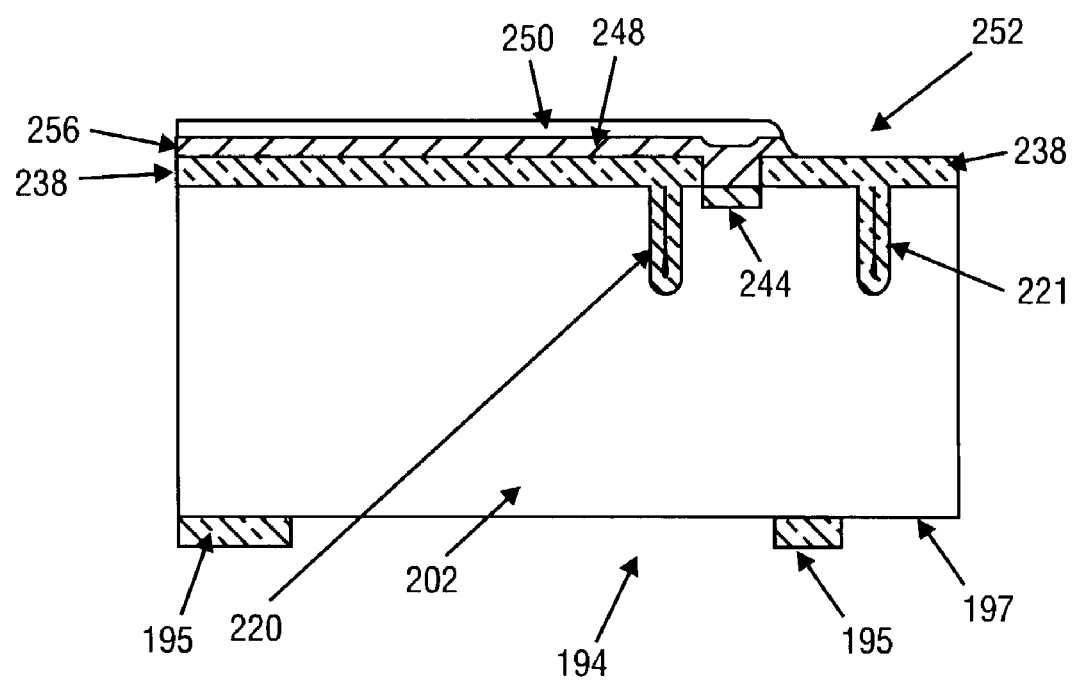

A third photolithography step is shown in FIG. 18. Lithography is performed with a spun-on resist layer 250 on the top surface of the metal layer 248. The resist is patterned to provide open area 252 where metal is not desired. This operation is referred to as coarse metal patterning. The opening 252 in the resist is transferred to the metal layer 248 by wet chemical etching or reactive ion etching. For aluminum RIE, a combination of $BCL_3$ and $CL_2$ in a parallel plate etcher is known in the art. The etch is stopped at the surface 236 of the oxide layer 238. The removal of metal at the opening 252 defines the region of metal 256.

Figure 19:
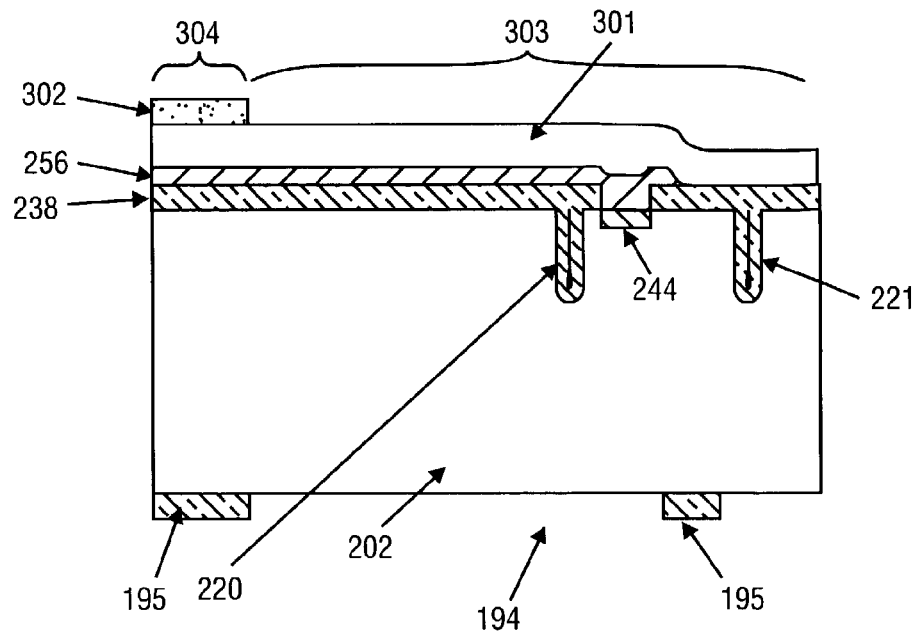

Resist layer 250 is removed. As shown in FIG. 19, a silicon dioxide layer 301 is conformally deposited over the top surface of the wafer 202 using a TEOS deposition. The thickness of this layer 301 for various embodiments is in the range of 1 um to 3 um, although other thicknesses are possible. Layer 301 is used to protect and passivate the metal traces, such as metal trace 256. Layer 301 is therefore referred to as the passivation oxide layer 301. Resist layer 302 is spun on and patterned using standard lithography techniques providing an opening 303 to the passivation.

Figure 20:
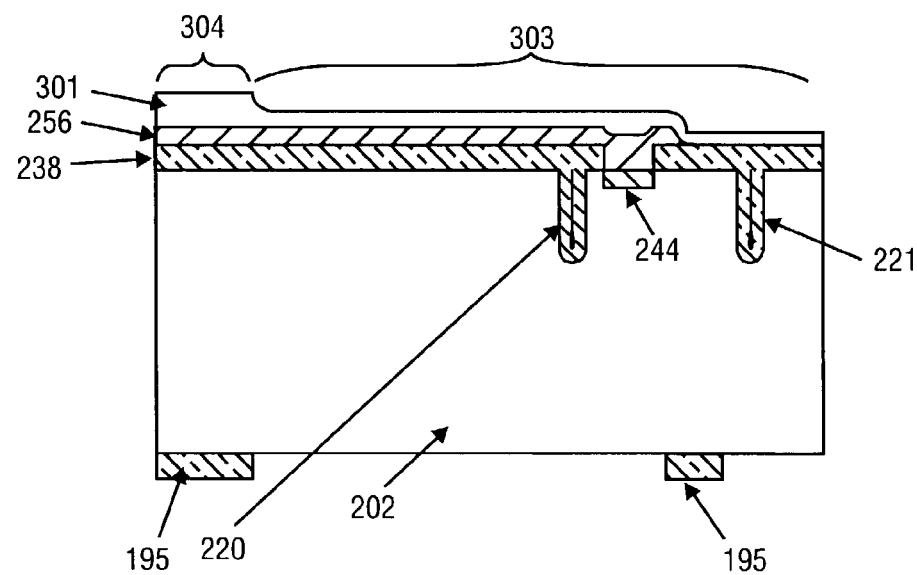

As shown in FIG. 20, using a timed etch, passivation oxide 301 is thinned to approximately 500 nm in region 303. The thinning process is carried out to make subsequent structural etches easier. As the thickness and number of masking layers increases, patterning them becomes more difficult. Thinning the passivation oxide 301 brings the total masking layer thickness down to an acceptable level. Region 304 that was covered by the resist 302 is maintained at the original thickness of region 304 of 1 um to 3 um.

Figure 21:
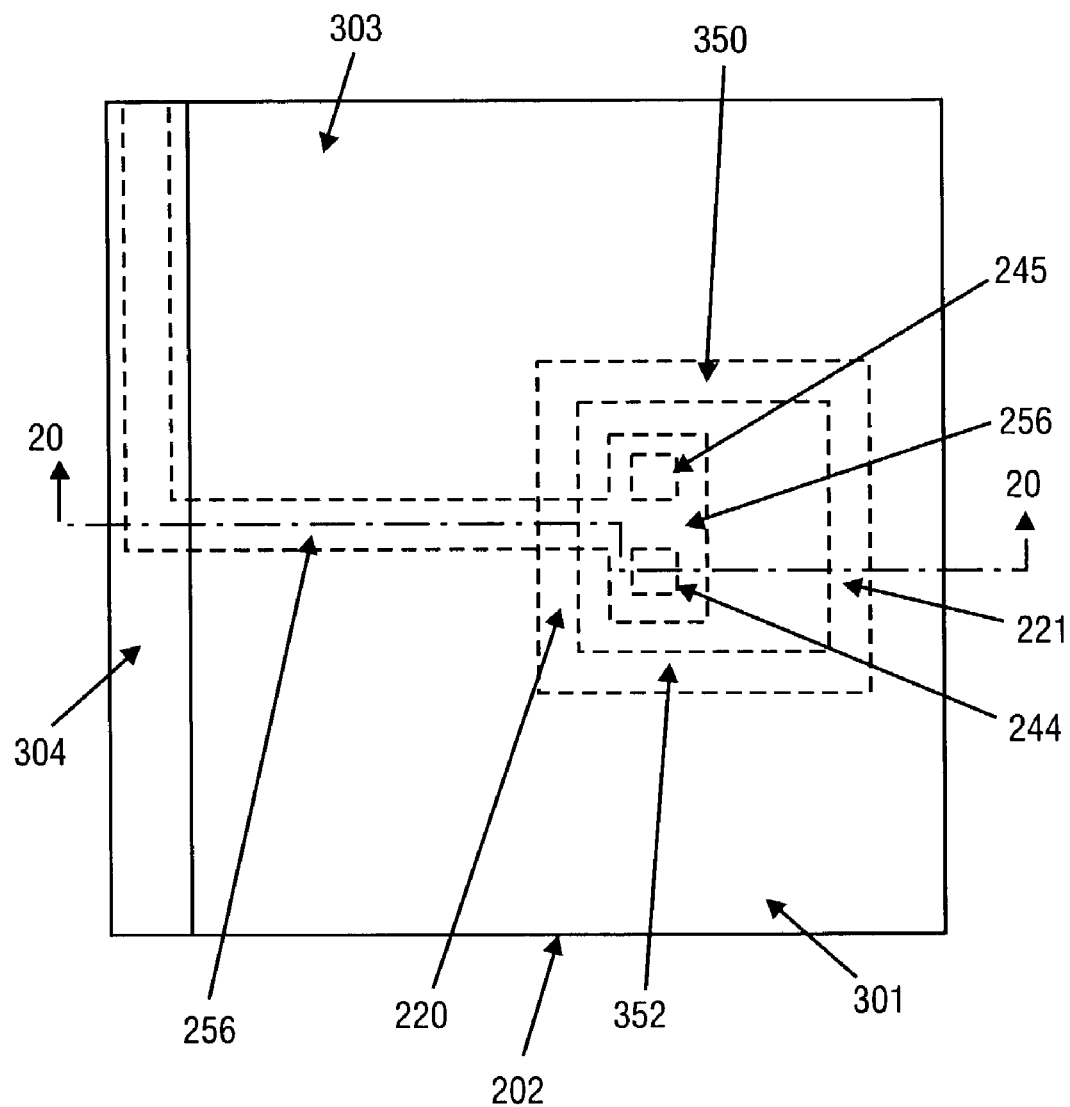

FIG. 21 is a top view of the section 202 of the wafer shown in FIG. 20. Section line 20 in FIG. 21 indicates the location of the cross section shown in FIG. 20. As shown in FIG. 21, silicon dioxide filled trenches 220, 221, 350, and 352 define an area that will become the lateral walls of a boundary isolation region. Metal layer 256 connects to the inside of the region defined by oxide-filled trenches 220, 221, 350, and 352. Contact regions 244 and 245 provide a contact interface between the silicon of wafer 202 and metal layer 256.

Figure 22:
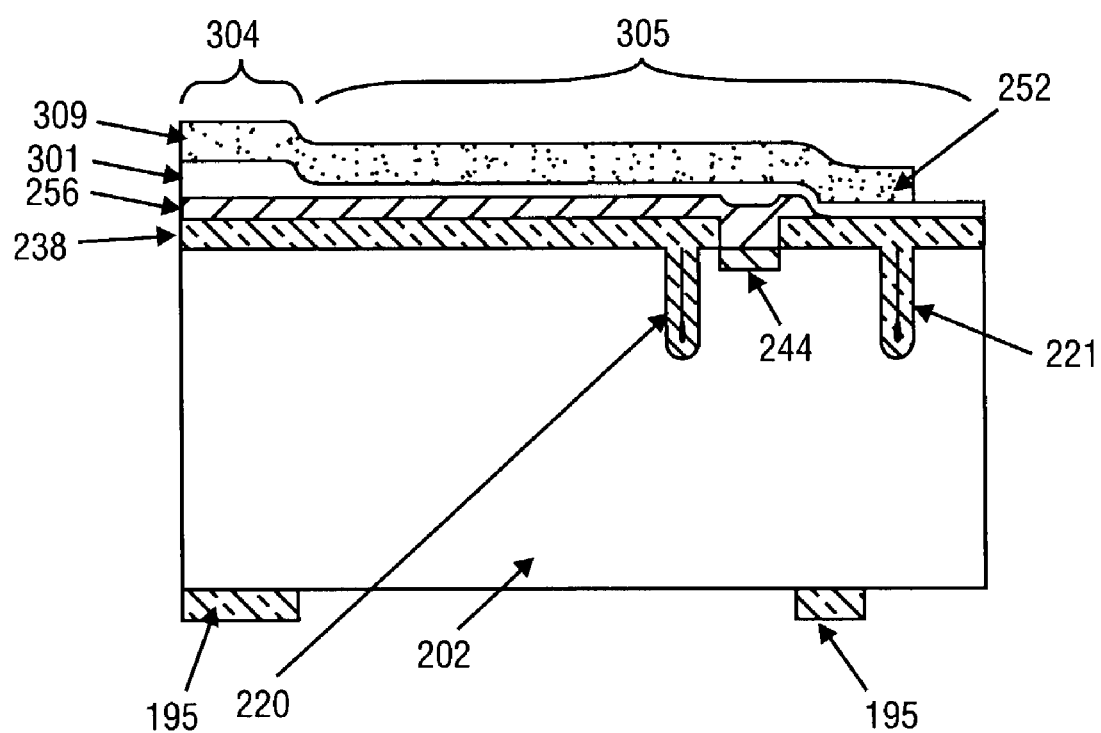

The structural components that connect to the boundary isolation structure are then defined. As shown in FIG. 22, photoresist layer 309 is spun onto the top of layer 301 and patterned into pattern 305 using standard lithography techniques.

Figure 23:
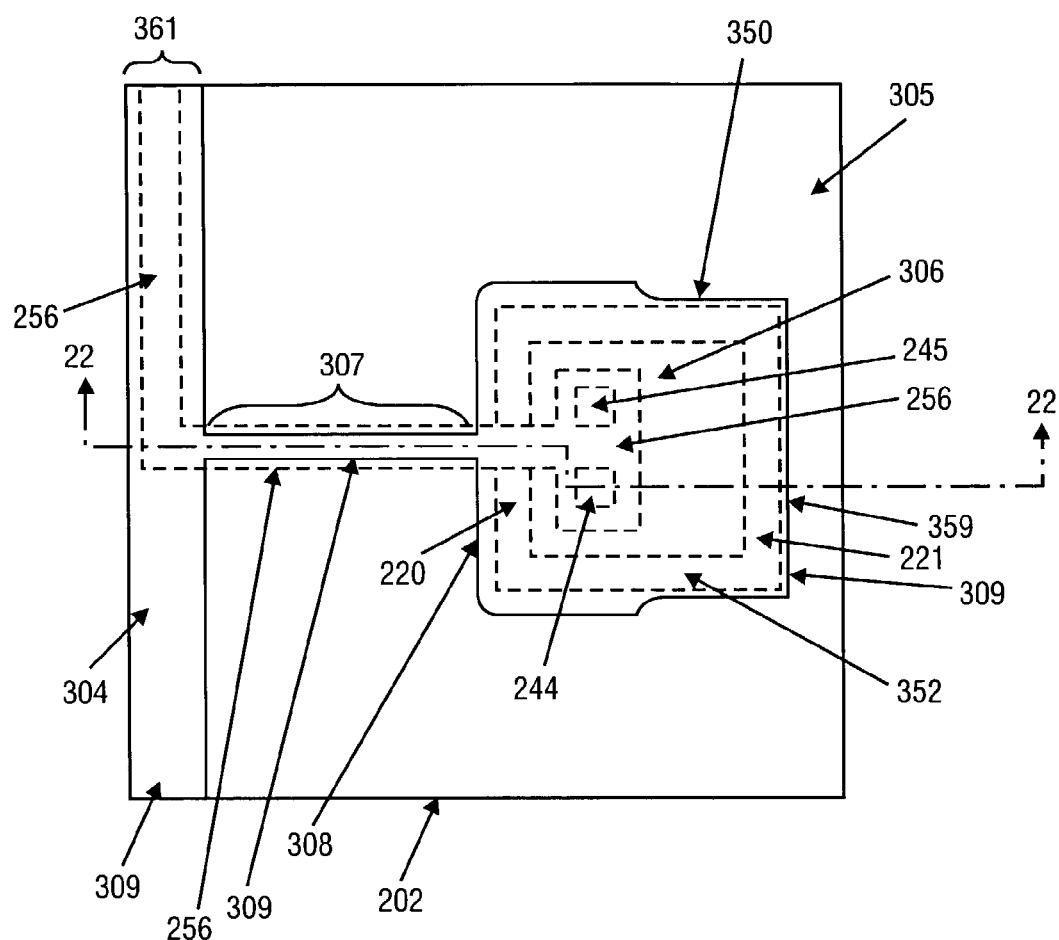

FIG. 23 is a top view of the wafer section 202 shown in FIG. 22. Section line 22 shown in FIG. 23 indicates the location of the cross section shown in FIG. 22. FIG. 23 provides a top view of pattern 305. Pattern 305 results in photoresist layer 309 completely covering boundary-isolated silicon region 306 and oxide lateral walls 220, 221, 350, and 356. The perimeter of photoresist layer 301 follows the outside border of the oxide trench isolation walls 220, 221, 350, and 352. How far the photoresist 309 extends beyond the outside perimeter of the oxide trench isolation walls 220, 221, 350, and 356 determines the thickness of the silicon wrapper that is generated. For example, at location 359, the edge of photoresist 309 is close to the outside perimeter of the oxide trench isolation wall 221, resulting in little to no silicon wrapper. In contrast, at location 308, which is an area where additional mechanical support is needed, photoresist layer 309 extends 1 um to 3 um beyond the outside perimeter of the oxide trench isolation wall 220 in order to form a silicon wrapper with a corresponding thickness.

Section 307 of photoresist layer 309 defined by pattern 305 is used to define a silicon beam that mechanically supports the silicon portion 306, also referred to as silicon platform 306. For certain embodiments, section 307 of photoresist layer 309 is 1 um to 3 um wide and 10 um to 50 um long.

Area 361 of photoresist layer 309 resides over oxide area 304. Metal layer 256 turns and extends perpendicularly under oxide layer 304 in order to connect to other circuitry.

As shown in FIG. 23, pattern 305 defines large areas outside of photoresist layer 309 that are to be removed in subsequent etch steps.

Figure 24:
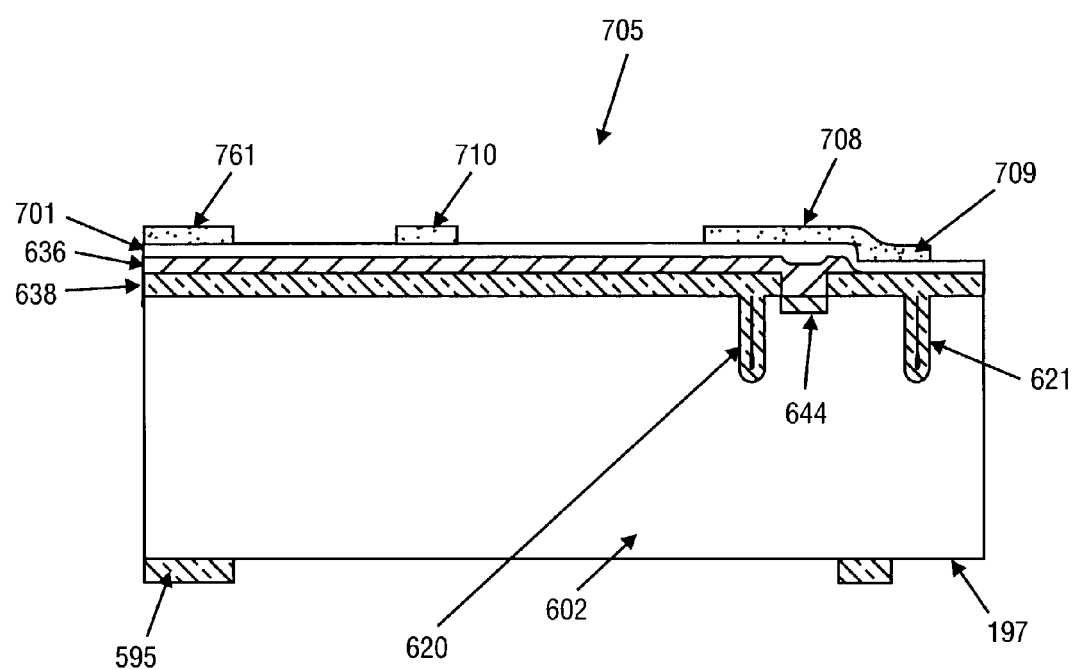

FIG. 24 shows a cross section of a section 602 of another silicon wafer to better illustrate the structure definition process through etching. Similar to wafer section 202 of FIG. 22, wafer section 602 has oxide trenches 620 and 621, silicon dioxide layer 638, metal layer 636, ohmic contact region 644, oxide layer 701, masking layer 595, and photoresist layer 709. Photoresist layer 709 includes photoresist sections 708, 710, and 761 that are part of photoresist pattern 705. The remaining process discussion will alternate between describing wafer section 202 and wafer section 602 in order to better describe the etching process.

A series of four anisotropic etches are used to transfer the resist patterns 305 and 705 of respective FIGS. 22-24 into respective silicon sections 202 and 602 of respective FIGS. 22-24. In order, these etches include an oxide etch, a metal etch, an oxide etch, and a silicon etch. Each of these etches uses a chemistry specific to the material being etched. For silicon wafer section 202 shown in cross section in FIG. 25, region or opening 372 is created by etching oxide layer 301, oxide layer 238, and a portion of silicon wafer section 202 to the right of oxide trench 221. For silicon wafer section 602 shown in cross section FIG. 26, trenches 782 and 784 are created by etching oxide layer 701, metal layer 656, oxide layer 638, and portions of silicon wafer section 602. Region or opening 772 is created by etching oxide layer 701, oxide layer 638, and a portion of silicon wafer section 602 to the right of oxide trench 621.

Figure 25:
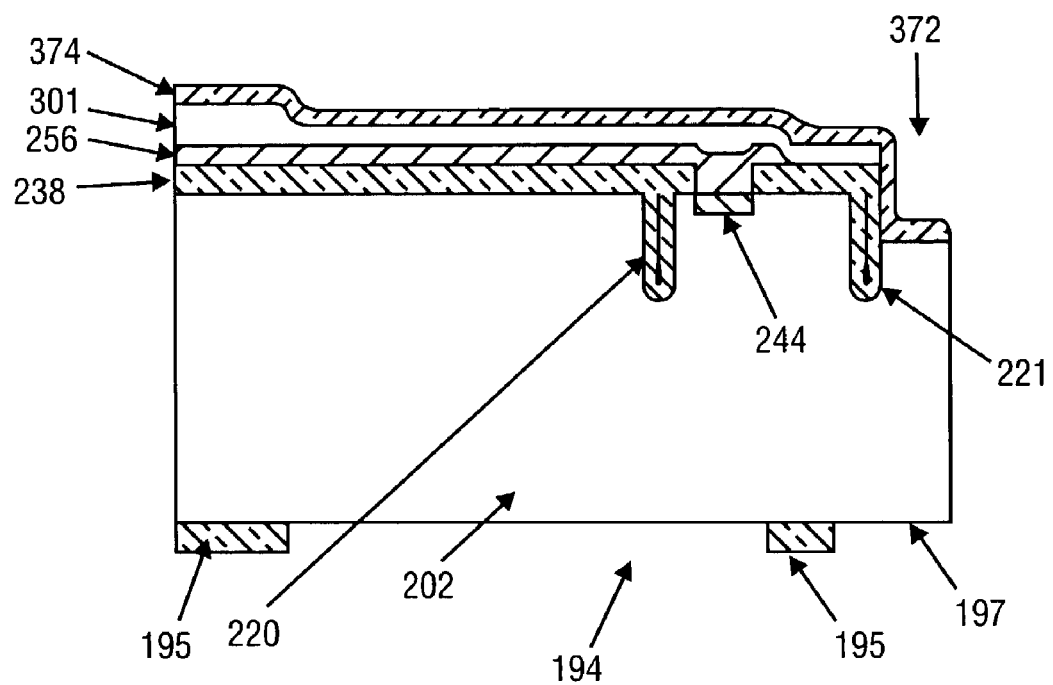
Figure 26:
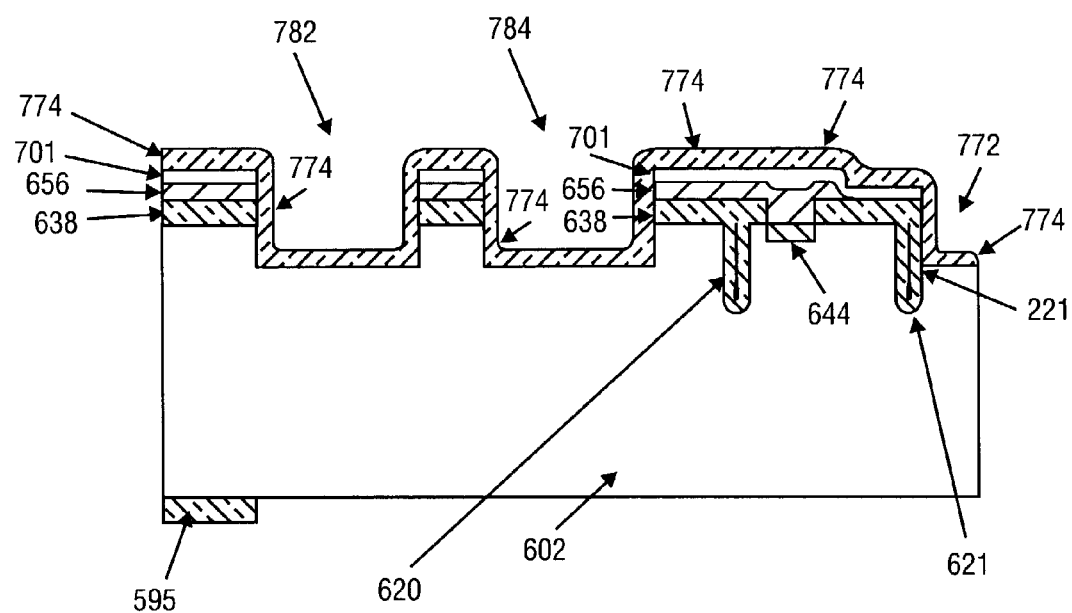

As part of the process, any remaining resist is etched off using an O2 plasma. A silicon dioxide layer is then conformally deposited using a TEOS deposition system. For wafer section 202 in FIG. 25, that deposited silicon dioxide layer is shown as oxide layer 374. For wafer section 602 in FIG. 26, that oxide layer is shown as oxide layer 774. The oxide layers 374 and 774 help to protect the silicon sidewalls during a later processing operation. The oxide layers 374 and 774 are referred to as sidewall oxides 374 and 774. As shown in FIG. 25, sidewall oxide 374 protects the sidewall of opening 372. As shown in FIG. 26, sidewall oxide 774 protects the sidewalls of trenches 782 and 784 and opening 772.

Figure 27:
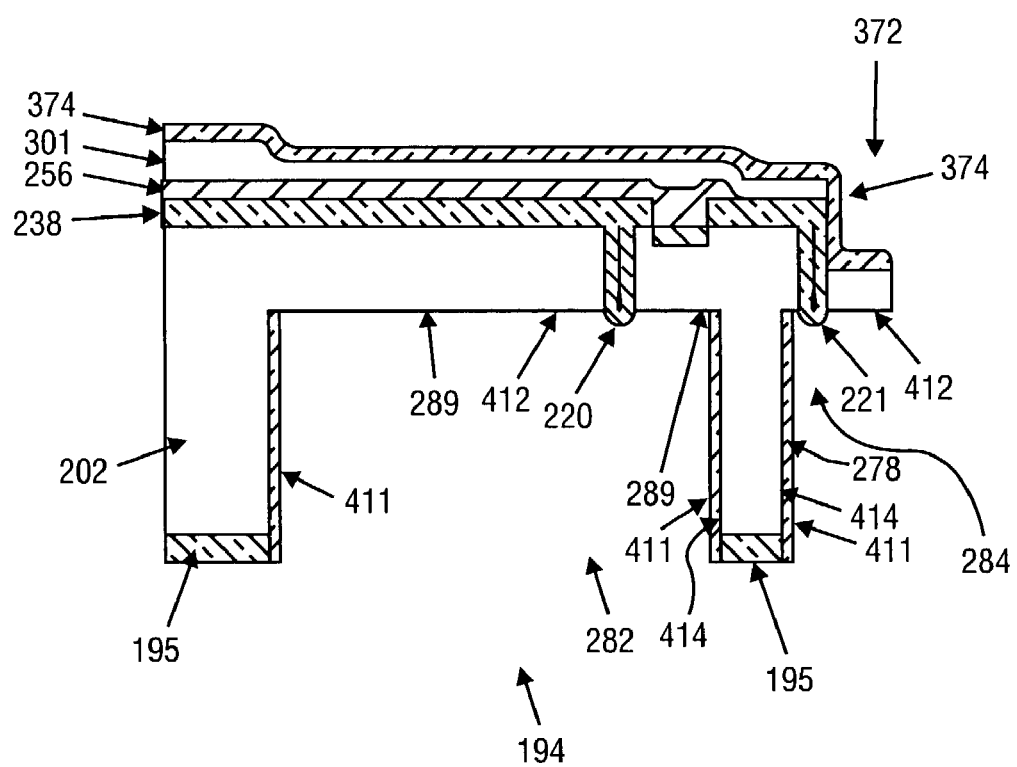
Figure 28:
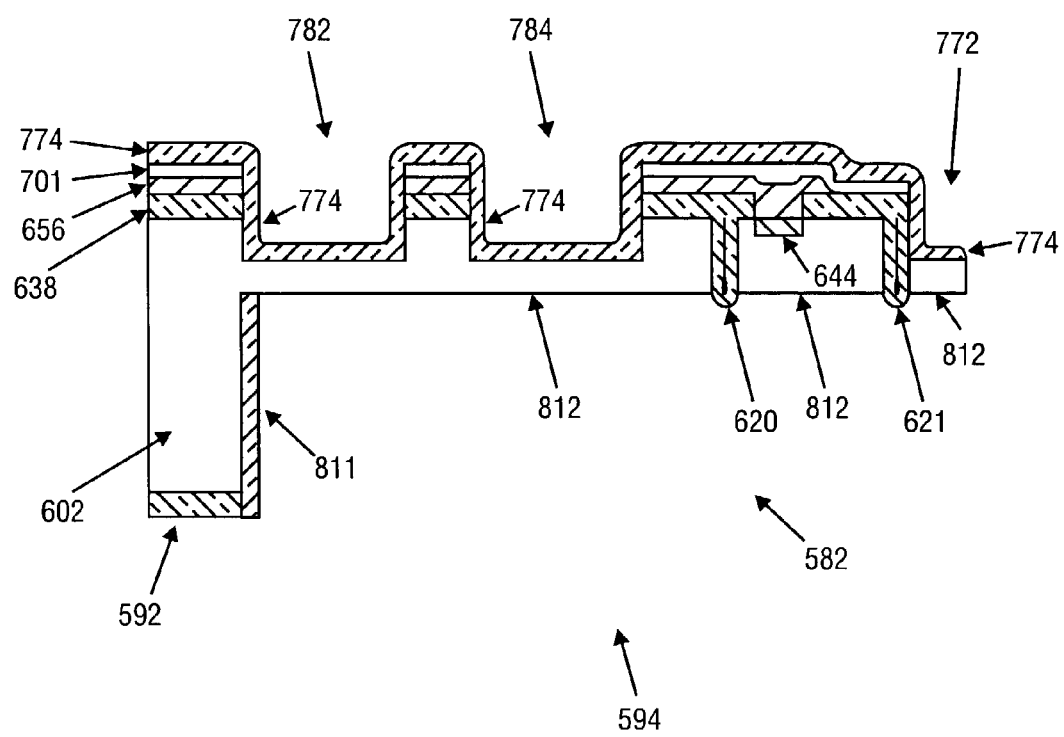

The respective wafers are etched on the backside. As shown in FIG. 27, backside silicon etching transfers the pattern 194 into substrate 202 to obtain blade 278 and windows or openings 282 and 284. As shown in FIG. 28, backside silicon etching transfers the pattern 594 into the substrate 602 to obtain opening 582. The respective etchings are performed using deep silicon etching at high selectivity to oxide using the techniques reported in U.S. Pat. No. 5,501,893 and now commonly used in the industry. As shown in FIG. 27, the deep silicon etching achieves near vertical profiles in the blade 278, which can be nominally 5-20 um wide and in excess of 300 um deep. Windows 282 and 284 likewise have nearly vertical profiles. Likewise, in FIG. 28, opening 582 has a nearly vertical profile. The etch is timed so that the etch front 289 in FIG. 27 approaches or just reaches a location past the bottoms of the isolation joints 220 and 221, yet does not punch through to the topside surface of the wafer 202. Moreover, to allow sufficient silicon to remain between isolation segments 220 and 221, the etch should be timed so that etch front 289 should not go too far beyond the bottoms of isolation segments or layers 220 and 221. Likewise, in FIG. 28, the etch is timed so that the etch front 812 approaches or just reaches a location past the bottoms of isolation joints 620 and 621, yet does not punch through the topside surface of wafer 602. Moreover, to allow sufficient silicon to remain between isolation segments 620 and 621, the etch should be timed so that the etch front 812 should not go too far beyond the bottoms of isolation segments or layers 620 and 621.

To further prevent punching through to the topside, one can segment the etch into multiple operations. After each operation, the wafer is inspected to see if the isolation joints 220 and 221 (or 620 and 621) are visible. Another indicator that one is close to clearing through to the isolation joints is that the silicon becomes semitransparent when thinned to dimensions less than 30 um. One can see the isolation joints as they are approached.

For other embodiments of the invention, the masking patterns are different from masking patterns 194 and 594 shown in respective FIGS. 27 and 28. For other embodiments, blade 278 is not formed. For example, for other embodiments, various micromechanical and MEMS structures are formed between isolation segments 220 and 221 (and isolation segments 620 and 621) by the use of various micromachining processes including, for example, the SCREAM process described in the article by K. A. Shaw, Z. L. Zhang, and N. C. MacDonald entitled *SCREAM I: A Single Mask, Single-Crystal Silicon, Reactive Ion Etching Process for Microelectromechanical Structures* in Sensors and Actuators A, 40 pp. 63-70 (1994). For other embodiments, other electrical and mechanical devices and structures are deposited, coupled, or injected in the backside regions between isolation segments 220, 221, 620, and 621. For example, active and passive integrated circuit components, light emitting diodes, light sensors, electrical sensors, radiation sensors, and motion sensors could be formed in the backside regions between isolation segments 220, 221, 620, and 621. As further examples, other shapes and forms of mechanical structures could be placed in the backside regions between isolation segments 220, 221, 620, and 621 by etching, depositing, or coupling those structures in that region.

For the embodiment shown in FIG. 27, a sidewall oxide is deposited on the backside and then etched back, thereby leaving oxide layers 411 on the sidewall and on the vertical silicon surfaces 414 of blade 278, but not on the exposed horizontal silicon surfaces 412. Likewise, for the embodiment of FIG. 28, sidewall oxide is deposited on the backside and then etched back, thereby leaving oxide layer 811 on the sidewall, but not on exposed horizontal silicon surfaces 812.

Figure 29:
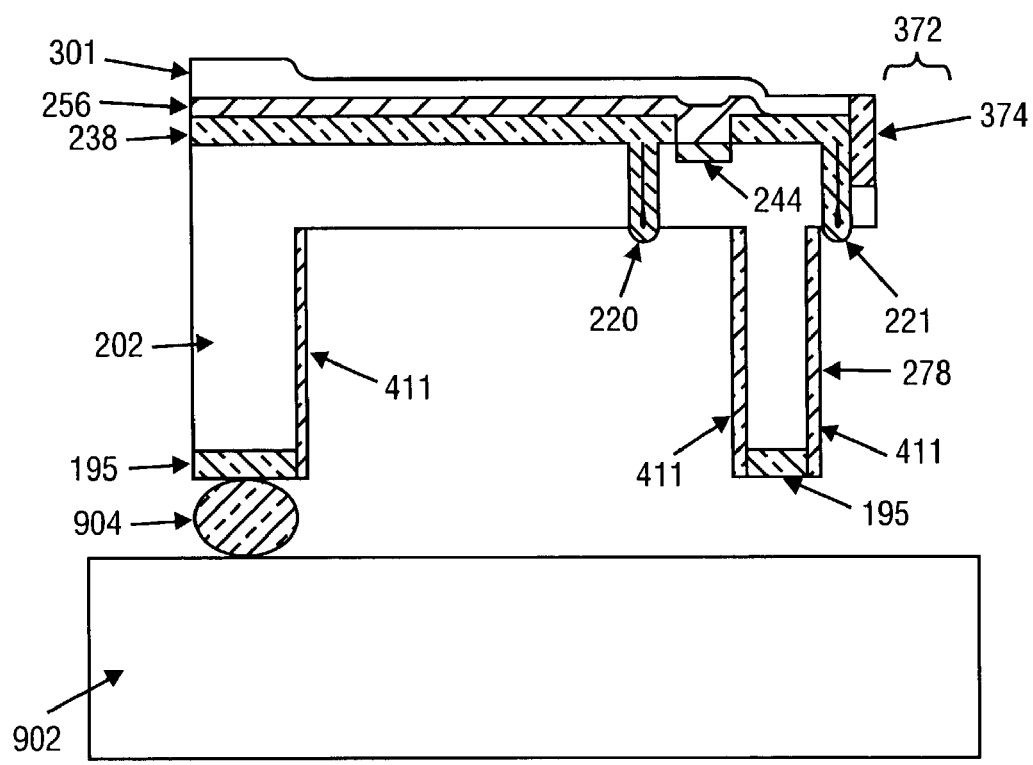
Figure 30:
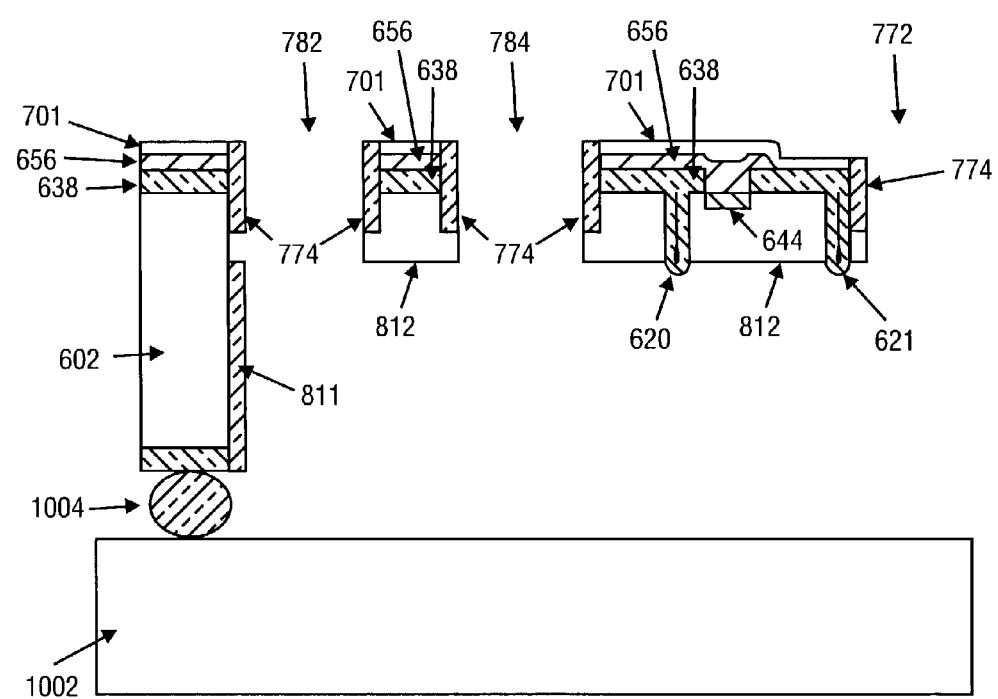

Referring to FIGS. 29 and 30, the respective wafers 202 and 602 are prepared for microstructure release. Microstructure release presents issues regarding mechanical support and backside cooling. An etch through the respective wafers 202 and 602 creates an opening from one side of the wafer to the other. The mechanical support issue relates to yield loss due to handling shock. The cooling issue relates to the fact that the wafers 202 and 602 are cooled in a reactive ion etcher by flowing a small amount of cooling gas on the opposite side of the respective wafer being etched. If there is an opening from one side of the wafer to the other side, cooling gas can leak into the etching region and alter the etch.

The mechanical support issue and the backside cooling issue are dealt with by bonding wafers 202 and 602 to respective other wafers. Methods of wafer bonding include use of a glass frit and use of anodic bonding.

FIG. 29 shows that base wafer 902 is bonded to wafer 202. The bonding is accomplished by using a glass frit material 904 that is heated to its flow temperature and then cooled. In this manner, a 400 degree centigrade temperature bond produces a hermetic seal. Wafer 602 of FIG. 30 is bonded in a similar manner to base wafer 1002 with the use of a glass frit 1004.

Referring to FIGS. 29 and 30, the wafers 202 and 602 are etched from the topside to clear the respective oxide layers 374 and 774 from the horizontal surfaces using an anisotropic oxide etch. This oxide etch is followed by a vertical anisotropic silicon etch from the top to break through the respective cavities 372, 782, 784, and 772 previously etched. The structures defined by that vertical anisotropic silicon etch are shown in FIGS. 29 and 30.

Figure 31:
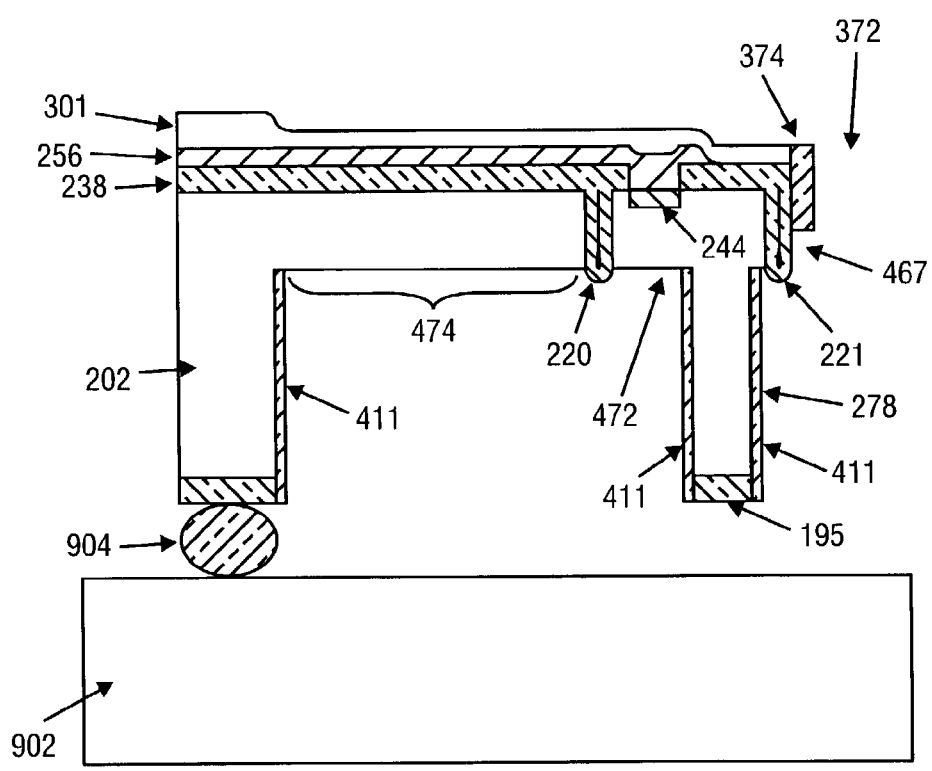
Figure 32:
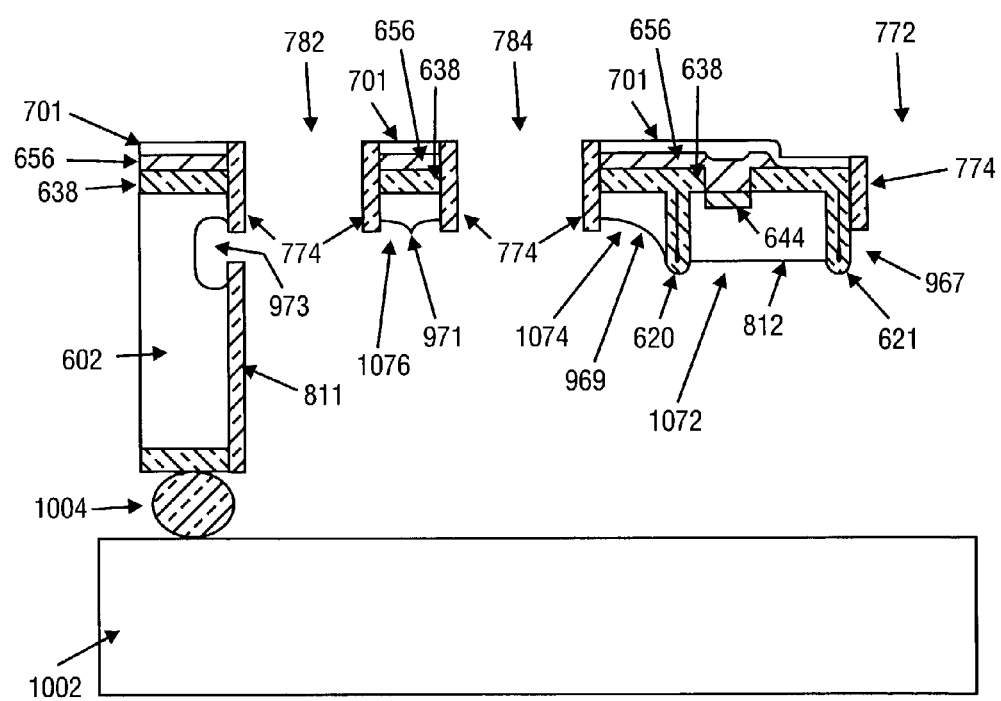

Referring to FIGS. 31 and 32, an isotropic etch is carried out to clear remaining material that is not passivated by a sidewall oxide. This isotropic etch helps to form the electrical isolation in the event that the backside silicon etch did not proceed long enough to expose the trench oxide isolation structures 220, 221, 620, and 621. The isotropic etch thus removes silicon from regions 467, 967, 969, 971, and 973.

The resulting structure shown in FIG. 31 includes a boundary isolation region 472 containing a blade 278. Boundary isolation region 472 is bounded by lateral oxide walls 220 and 221, and covered by oxide layer 238. Silicon beam 474 connects boundary isolation region 472 to the rest of the MEMS structures.

The resulting structure shown in FIG. 32 includes a boundary isolation region 1072 bounded by lateral oxide walls 620 and 621, and covered by oxide layer 638. Silicon beam 1074 is coupled to boundary isolation region 1072. FIG. 32 also shows a cross section of silicon beam 1076 that has sidewall oxide layers 774, an oxide layer 638 over silicon, a metal layer 656, and a passox oxide layer 701.

Figure 33:
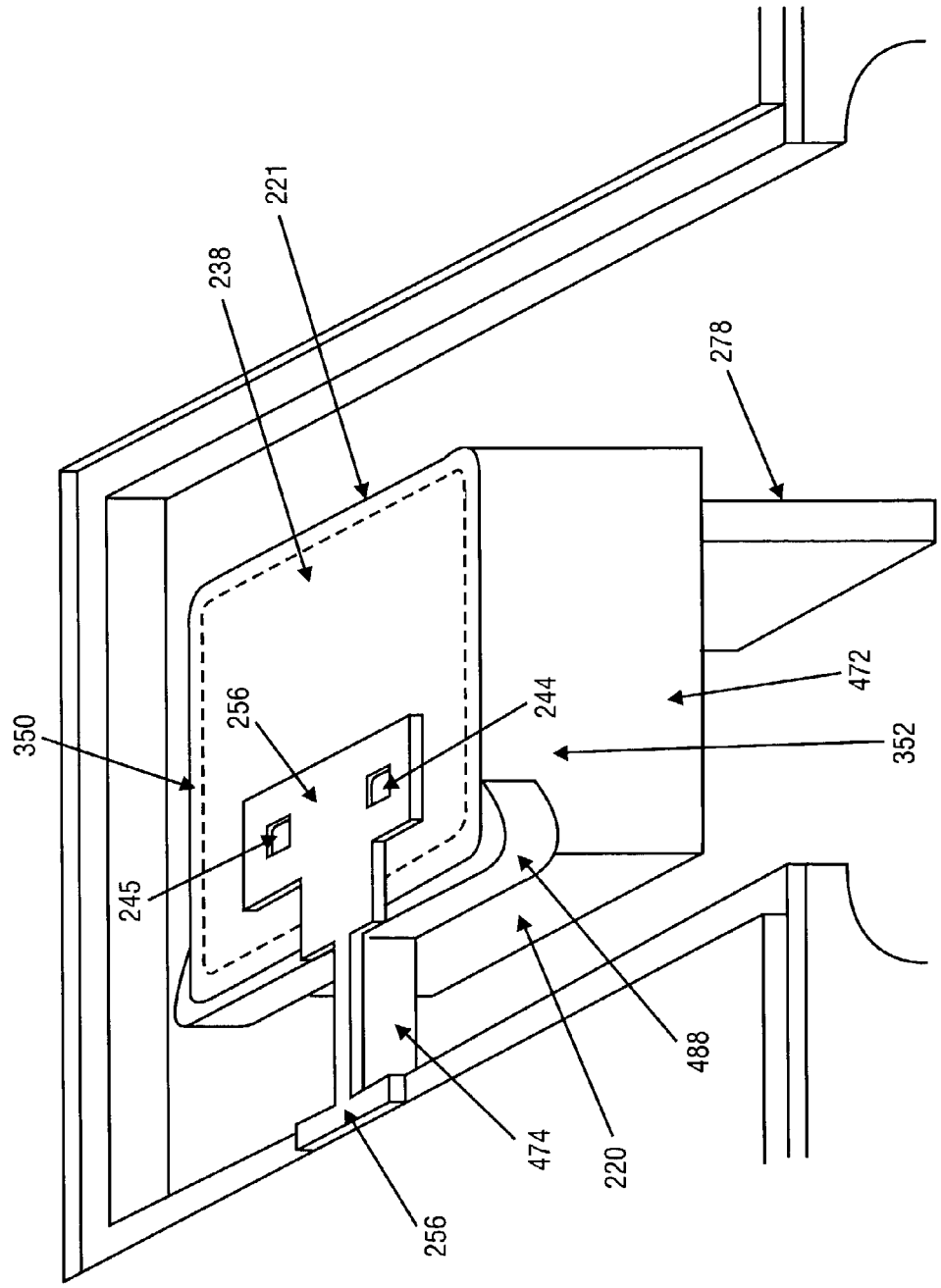

FIG. 33 is a perspective view of the completed boundary isolation structure 472 coupled to silicon beam 474. Boundary isolation structure 472 is surrounded by lateral oxide walls 220, 221, 350, and 352. The top of boundary isolation structure 472 is covered by oxide layer 238. Metal layer or trace 256 runs across silicon beam 474 and over a portion of the top of boundary isolation structure 472. Contact regions 244 and 245 provide a contact interface between metal layer 256 and the underlying silicon. An oxide layer 301 covering metal layer 256 and oxide layer 238 is not shown in FIG. 33. Silicon wrapper 488 resides on the outside of a portion of boundary isolation structure 472. A blade 278 extends from the bottom of isolation structure 472.

Although in the discussion of the micromachining process references have been made to the topside or top and backside or bottom of silicon wafer sections, those references are not intended to limiting. For other embodiments of the invention, the top and the backside could be reversed for the micromachining process. Moreover, once the MEMS structure or device is fabricated, the MEMS structure or device can for some embodiments be flipped, with the bottom or backside of the processed silicon wafer becoming the top or topside of the MEMS structure or device. Likewise, after flipping, the top or topside of the processed silicon wafer becomes the bottom or backside of the MEMS structure or device. For other embodiments, there is no flipping of the processed silicon wafer at the end of the micromachining process.

There are numerous alternative process variations that could be used to fabricate boundary isolation MEMS or micromechanical devices. For example, the metallization could be comprised of other materials besides aluminum, such as copper, tungsten, or titanium. Alternative dielectrics that could be deposited to form a boundary isolation layer include a doped silicon dioxide (for example, fluorine-doped silicon dioxide), silicon nitride, silicon oxynitride, spin-on-glass, BPSG, and composite films. Alternatively, silicon nitride could be grown to form a boundary isolation layer. For other embodiments, the dielectric layers could comprise a combination of silicon nitride and polysilicon.

For an alternative embodiment, the micromachining process does not use thermally grown oxide, but instead uses deposited oxide. The resulting process is a low temperature process. Such a low temperature process might not even out scalloping caused by etching, but such scalloping would not be expected to degrade the performance of a structure employing boundary isolation.

Embodiments of the invention use monocrystalline silicon in the fabrication process. Alternatively, other forms of silicon could be used, such amorphous silicon, polycrystalline silicon, and epitaxial silicon. For alternative embodiments, other materials could be used in place of silicon, such as gallium arsenide, germanium, and silicon germanium. For other embodiments, an SOI substrate could be used.

For one embodiment, the micromachining process of one embodiment of the invention is used to provide boundary isolation for micromechanical structures such as blades used on MEMS gimbaled mirrors with electrostatic actuation. Arrays of MEMS gimbaled mirrors employing boundary isolation can receive voltages on the order of 250 volts.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A micromechanical structure, comprising:
    a region of semiconductor material having a first surface, a second surface opposite to the first surface, and a lateral surface that surrounds the region of semiconductor material;
    insulative material covering the first surface and the lateral surface of the region of semiconductor material to provide electrical isolation to the region of semiconductor material by forming a boundary, a silicon beam coupled to the insulative material, wherein the silicon beam is mechanically compliant and permits the region of semiconductor material to have a range of motion and wherein the silicon beam comprises a lower layer of silicon and an upper insulative layer.

2. The micromechanical structure of claim 1, wherein the insulative material covering the lateral surface of the region of semiconductor material forms a lateral boundary that extends beyond the second surface of the region of semiconductor material.

3. The micromechanical structure of claim 1, wherein the insulative material covering the first surface of the region of semiconductor material includes a via to the region of semiconductor material.

4. The micromechanical structure of claim 3, further comprising an electrical connection through the via of the insulative material to the region of semiconductor material.

5. The micromechanical structure of claim 1, wherein the insulative material comprises an oxide.

6. The micromechanical structure of claim 1, wherein the insulative material comprises silicon dioxide.

7. The micromechanical structure of claim 1, wherein the semiconductor material comprises silicon.

8. The micromechanical structure of claim 1, further comprising a micromechanical member residing in the region of semiconductor material.

9. The micromechanical structure of claim 8, wherein the micromechanical member comprises one-half of an actuator structure.

10. A micromechanical structure, comprising:
    a region of semiconductor material having a first surface, a second surface opposite to the first surface, and a lateral surface that surrounds the region of semiconductor material; insulative material covering the first surface and the lateral surface of the region of semiconductor material to provide electrical isolation to the region of semiconductor material by forming a boundary a rigid frame;
    a silicon beam coupled between the rigid frame and the insulative material covering the lateral surface of the region of the semiconductor material; and
    a compliant flexure coupled to the rigid frame.

11. A micromechanical structure comprising:
    a region of semiconductor material having a first surface, a second surface opposite to the first surface, and a lateral surface that surrounds the region of semiconductor material:
    insulative material covering the first surface and the lateral surface of the region of the semiconductor material to provide electrical isolation to the region of semiconductor material by forming a boundary;
    a via through the insulative material to the region of semiconductor material;
    a silicon beam coupled to the insulative material, and to a substrate wherein the silicon beam has an upper insulative layer;
    a conductive path residing over the insulative layer of the silicon beam is mechanically compliant and a portion of the insulative material covering the first surface of the region of the semiconductor material, wherein the conductive path comprises a metal trace and contacts the region of semiconductor material through the via.

12. A micromechanical apparatus comprising:
    boundary means for covering lateral surfaces of a region of semiconductor material and for covering a first surface of the region of semiconductor material for providing electrical isolation to the region of semiconductor material without covering a second surface of the region of semiconductor material wherein the boundary means comprises a dielectric that covers the lateral surfaces and the first surface of the region of semiconductor material;
    a silicon beam to suspend the region of semiconductor material over a substrate and a metal trace coupled to the region of semiconductor material through a via in the dielectric to provide a defined conduction path to the region of semiconductor material.

13. The micromechanical apparatus of claim 12, wherein the substrate contains micromechanical structure under the region of semiconductor material.

14. The micromechanical apparatus of claim 12, wherein the means for suspending comprises rigid means.

15. The micromechanical apparatus of claim 12, wherein the means for suspending comprises compliant means.

16. A method for forming a micromechanical structure, comprising:
    etching a trench in a semiconductor substrate to surround a region of the semiconductor substrate;
    oxidizing a surface of the semiconductor substrate and the trench to form a first oxide and a lateral oxide region;
    etching a backside of the semiconductor substrate to expose a backside of the region of the semiconductor substrate and a portion of the lateral oxide region.

17. The method of claim 16, further comprising:
    performing a topside etch to punch through the semiconductor substrate.

18. The method of claim 16, further comprising:
    etching a via in the first oxide.

19. The method of claim 18, further comprising:
    depositing metal on the first oxide and in the via, wherein the metal contacts the region of the semiconductor substrate.

20. The method of claim 19, further comprising:
    patterning the metal on the first oxide.

21. The method of claim 16, further comprising:
    performing an isotropic etch of the semiconductor substrate.

22. The method of claim 16, wherein the semiconductor substrate comprises a silicon substrate and wherein the first oxide and the lateral oxide comprise silicon dioxide.

23. The method of claim 16, wherein etching a backside of the semiconductor substrate further comprises forming a member on the backside of the region of the semiconductor substrate.

24. A method for forming a micromechanical structure, comprising:
    etching a trench in a semiconductor substrate to surround a region of the semiconductor substrate:
    oxidizing a surface of the semiconductor substrate and the trench to form a first oxide and a lateral oxide region;
    etching the semiconductor substrate to form (1) a boundary isolation structure bounded by the lateral oxide region and (2) a beam coupled to the boundary isolation structure;
    etching a backside of the semiconductor substrate to expose a backside of the region of the semiconductor substrate and a portion of the lateral oxide region;
    etching through a topside of the semiconductor substrate to release the beam and the boundary isolation structure.

25. The method of claim 24, further comprising performing an isotropic etch of the semiconductor substrate.

* * * * *